(12) United States Patent
Patra et al.

(10) Patent No.: US 9,213,244 B2
(45) Date of Patent: Dec. 15, 2015

(54) ILLUMINATION SYSTEM OF A MICROLITHOGRAPHIC PROJECTION EXPOSURE APPARATUS

(71) Applicant: Carl Zeiss SMT GmbH, Oberkochen (DE)

(72) Inventors: Michael Patra, Oberkochen (DE); Markus Schwab, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 407 days.

(21) Appl. No.: 13/727,903

(22) Filed: Dec. 27, 2012

(65) Prior Publication Data

US 2013/0114060 A1    May 9, 2013

Related U.S. Application Data

(63) Continuation of application No. PCT/EP2010/005317, filed on Aug. 30, 2010.

(51) Int. Cl.
*G03B 27/72* (2006.01)
*G03F 7/20* (2006.01)

(52) U.S. Cl.
CPC ........ *G03F 7/70191* (2013.01); *G03F 7/70091* (2013.01); *G03F 7/70116* (2013.01)

(58) Field of Classification Search
CPC ............ G03F 7/70091; G03F 7/70116; G03F 7/70191; G03F 7/70075; G03F 7/70083; G03F 7/70058; G03F 7/70108
USPC .................................................... 355/67, 53
See application file for complete search history.

(56) References Cited

U.S. PATENT DOCUMENTS

| 5,615,047 A | 3/1997 | Komatsuda et al. |
| 6,049,374 A | 4/2000 | Komatsuda et al. |

(Continued)

FOREIGN PATENT DOCUMENTS

| DE | 10 2009 045 219 | 3/2011 |
| EP | 1 170 625 A2 | 1/2002 |

(Continued)

OTHER PUBLICATIONS

International Search Report for corresponding PCT Appl No. PCT/EP2010/005317, mailed May 4, 2011.

(Continued)

*Primary Examiner* — Peter B Kim
(74) *Attorney, Agent, or Firm* — Fish & Richardson P.C.

(57) ABSTRACT

An illumination system of a microlithographic projection exposure apparatus includes an optical integrator that includes an array of optical raster elements. A condenser superimposes the light beams associated with the optical raster elements in a common field plane. A modulator modifies a field dependency of an angular irradiance distribution in an illuminated field. Units of the modulator are associated with one of the light beams and are arranged at a position in front of the condenser such that only the associated light beam impinges on a single modulator unit. The units are configured to variably redistribute, without blocking any light, a spatial and/or an angular irradiance distribution of the associated light beams. A control device controls the modulator units if it receives an input command that the field dependency of the angular irradiance distribution in the mask plane shall be modified.

26 Claims, 14 Drawing Sheets

(56) References Cited

U.S. PATENT DOCUMENTS

| | | |
|---|---|---|
| 7,061,582 B2 | 6/2006 | Zinn et al. |
| 2003/0038225 A1 | 2/2003 | Mulder et al. |
| 2006/0087634 A1 | 4/2006 | Brown et al. |
| 2009/0021715 A1 | 1/2009 | Deguenther et al. |
| 2009/0053618 A1* | 2/2009 | Goehnermeier .......... 430/5 |
| 2009/0116093 A1 | 5/2009 | Tanitsu |
| 2010/0157269 A1 | 6/2010 | Deguenther et al. |
| 2011/0211183 A1 | 9/2011 | Tanitsu |

FOREIGN PATENT DOCUMENTS

| | | |
|---|---|---|
| EP | 1170635 A2 * | 1/2002 |
| EP | 1 262 836 A1 | 12/2002 |
| EP | 1 357 431 | 10/2003 |
| JP | 11-003849 | 1/1999 |
| JP | 2003-022967 A | 1/2003 |
| JP | 2003-218017 | 7/2003 |
| JP | 2010-067866 | 3/2010 |
| JP | 2010-537414 | 12/2010 |
| WO | WO 2005/026843 | 3/2005 |
| WO | WO 2007/093433 | 8/2007 |
| WO | WO 2009/026947 | 3/2009 |
| WO | WO 2010/024106 | 3/2010 |
| WO | WO 2011/039261 | 4/2011 |

OTHER PUBLICATIONS

Japanese Office Action, with translation thereof, for JP Appl No. 2013-524354, dated Jan. 5, 2015.

Japanese Office Action, with translation, for JP Appl No. 2013-524354, dated Feb. 5, 2014.

E. Delano, "First-order Design and the $\gamma$, $\bar{\gamma}$ Diagram", Applied Optics, 1963, vol. 2, No. 12, pp. 1251-1256.

* cited by examiner

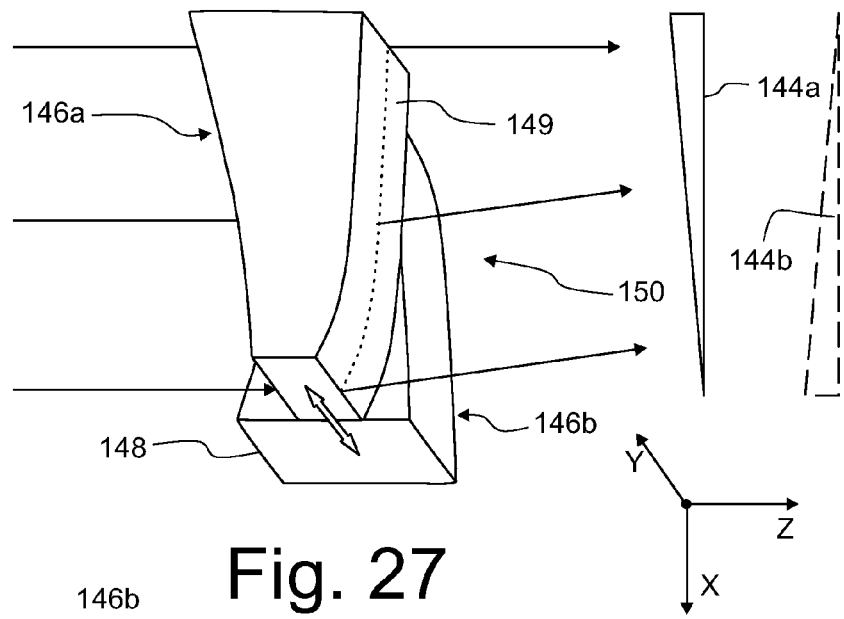
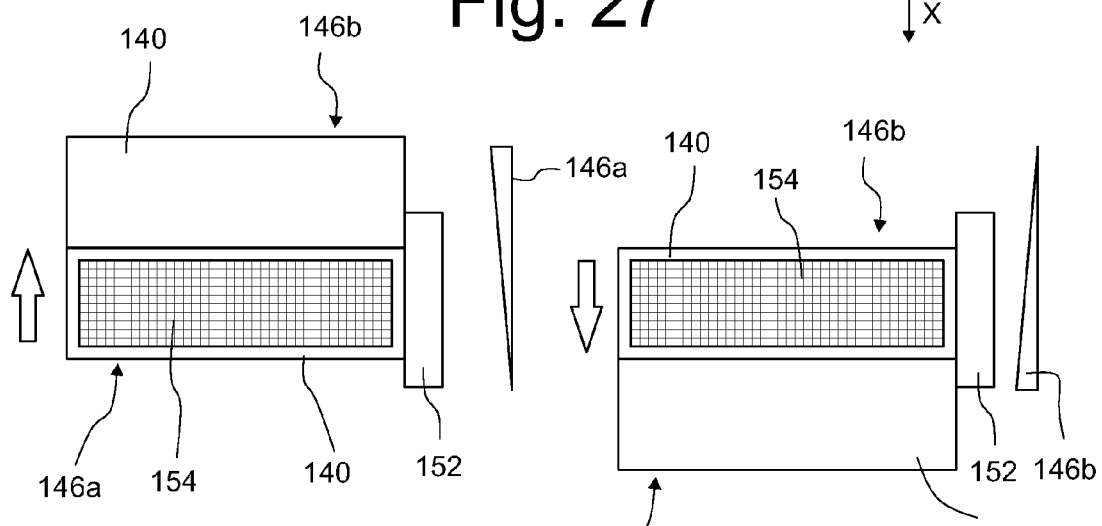
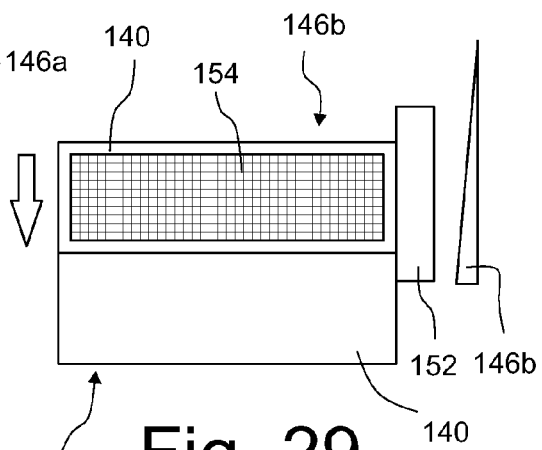
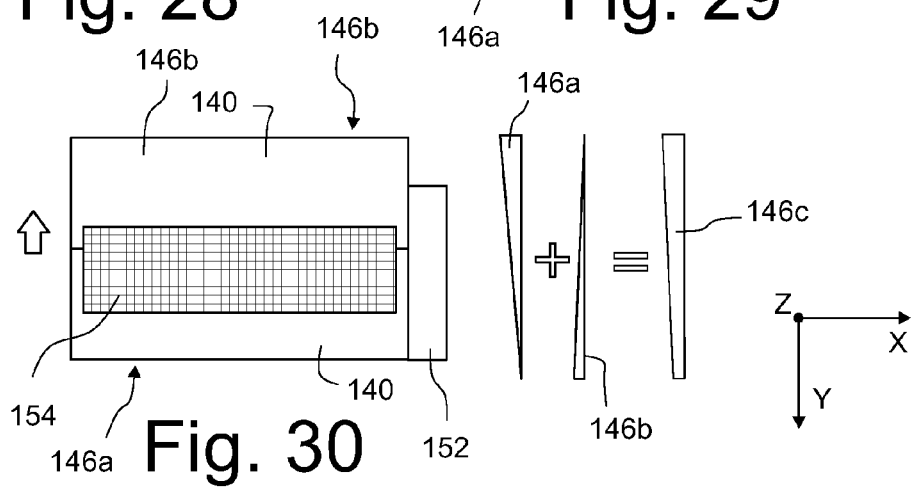

ILLUMINATION SYSTEM OF A MICROLITHOGRAPHIC PROJECTION EXPOSURE APPARATUS

CROSS-REFERENCE TO RELATED APPLICATIONS

The present application is a continuation of, and claims benefit under 35 USC 120 to, international application PCT/EP2010/005317, filed Aug. 30, 2010. International application PCT/EP2010/005317 is hereby incorporated by reference in its entirety.

FIELD

The disclosure generally relates to an illumination system of a microlithographic projection exposure apparatus and to a method of operating such an apparatus.

BACKGROUND

Microlithography (also referred to as photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to light of a certain wavelength. Next, the wafer with the photoresist on top is exposed to projection light through a mask in a projection exposure apparatus. The mask contains a circuit pattern to be imaged onto the photoresist. After exposure the photoresist is developed to produce an image that corresponds to the circuit pattern contained in the mask. Then an etch process transfers the circuit pattern into the thin film stacks on the wafer. Finally, the photoresist is removed. Repetition of this process with different masks results in a multi-layered microstructured component.

A projection exposure apparatus typically includes an illumination system that illuminates a field on the mask that may have the shape of a rectangular or curved slit, for example. The apparatus further includes a mask stage for aligning the mask, a projection objective (sometimes also referred to as 'the lens') that images the illuminated field on the mask onto the photoresist, and a wafer alignment stage for aligning the wafer coated with the photoresist.

A desire in the development of projection exposure apparatus is to be able to lithographically define structures with smaller and smaller dimensions on the wafer. Small structures lead to a high integration density, which generally has a favorable effect on the performance of the microstructured components produced with the aid of such apparatus.

Various approaches have been pursued in the past to achieve this aim. One approach has been to reduce the wavelength of the projection light used to image the circuit pattern onto the photoresist. This exploits that fact that the minimum size of the features that can be lithographically defined is approximately proportional to the wavelength of the projection light. Therefore the manufacturers of such apparatus strive to use projection light having shorter and shorter wavelengths. The shortest wavelengths currently used are 248 nm, 193 nm and 157 nm and thus lie in the deep (DUV) or vacuum (VUV) ultraviolet spectral range. The next generation of commercially available apparatus will use projection light having an even shorter wavelength of about 13.5 nm which is in the extreme ultraviolet (EUV) spectral range. An EUV apparatus contains mirrors instead of lenses because the latter absorb nearly all EUV light.

Another approach is to improve the illumination of the mask. Ideally, the illumination system of a projection exposure apparatus illuminates each point of the field illuminated on the mask with projection light having a well defined spatial and angular irradiance distribution. The term angular irradiance distribution describes how the total light energy of a light bundle, which converges towards a particular point on the mask, is distributed among the various directions of the rays that constitute the light bundle.

The angular irradiance distribution of the projection light impinging on the mask is usually adapted to the kind of pattern to be imaged onto the photoresist. For example, relatively large sized features may involve a different angular irradiance distribution than small sized features. The most commonly used angular irradiance distributions are referred to as conventional, annular, dipole and quadrupole illumination settings. These terms refer to the irradiance distribution in a pupil surface of the illumination system. With an annular illumination setting, for example, only an annular region is illuminated in the pupil surface. Thus there is only a small range of angles present in the angular irradiance distribution of the projection light, and all light rays impinge obliquely with similar angles onto the mask.

Different approaches are known in the art to modify the angular irradiance distribution of the projection light in the mask plane so as to achieve the desired illumination setting. For achieving maximum flexibility in producing different angular irradiance distribution in the mask plane, it has been proposed to use mirror arrays that determine the irradiance distribution in the pupil surface.

In EP 1 262 836 A1 the mirror array is realized as a microelectromechanical system (MEMS) including more than 1000 microscopic mirrors. Each of the mirrors can be tilted about two orthogonal tilt axes. Thus radiation incident on such a mirror device can be reflected into almost any desired direction of a hemisphere. A condenser lens arranged between the mirror array and a pupil surface translates the reflection angles produced by the mirrors into locations in the pupil surface. This illumination system makes it possible to illuminate the pupil surface with a plurality of spots, wherein each spot is associated with one particular mirror and is freely movable across the pupil surface by tilting this mirror.

Similar illumination systems using mirror arrays are known from US 2006/0087634 A1, U.S. Pat. No. 7,061,582 B2 and WO 2005/026843 A2.

Although illumination systems using mirror arrays are very flexible for modifying the angular irradiance distribution, the uniformity of the spatial and angular irradiance distribution over the illuminated field in the mask plane is still an issue. Future generations of illumination systems are likely to involve a very low field dependency of these quantities.

Some of the approaches that have been developed to reduce the field dependency focus on the optical integrator that is usually used in illumination systems to produce a plurality of secondary light sources. The light beams emitted by the secondary light sources are superimposed by a condenser onto a mask plane or onto a field stop plane which is optically conjugate to the mask plane. The optical integrator usually includes one or more arrays of optical raster elements producing the light beams that are associated with the secondary light sources. One or more optical raster elements which are exclusively associated with such a light beam form an optical channel that is independent from other optical channels. Since each light beam associated with an optical channel completely illuminates the mask or field stop plane, optical elements located within the optical channels can be used to modify the illumination properties.

For example, U.S. Pat. No. 5,615,047 describes a plate which is arranged in front of an optical integrator and includes a plurality of filter areas each being associated with a single optical channel of the optical integrator. Since the position of the filter element is optically conjugate to the mask or field stop plane, the transmissivity distribution of a filter area can be selected such that a uniform spatial irradiance distribution at the mask or field stop plane is obtained.

Also U.S. Pat. No. 6,049,374 proposes to use absorptive filter elements that are associated with particular channels of the optical integrator.

US 2009/0021715 A1, which is assigned to the applicant of the present application, describes an illumination system in which undesired residual field dependencies of the angular irradiance distribution are removed. To this end optical elements such as prisms placed in individual optical channels change certain optical properties of the light beams associated with these optical channels.

However, there is still a desire for improvements of illumination systems in particular with regard to the field dependency of the angular irradiance distribution of the projection light impinging on the mask.

SUMMARY

The disclosure seeks to provide an illumination system which offers increased flexibility with regard to the field dependency of the angular irradiance distribution at mask level.

In one aspect, the disclosure provides an illumination system including an optical integrator which includes an array of optical raster elements, wherein a light beam is associated with each optical raster element. The illumination system further includes a condenser which superimposes the light beams associated with the optical raster elements in a common field plane which is equal to or optically conjugate to a mask plane in which a mask to be illuminated is positioned during operation of the illumination system. A modulator of the illumination system is configured to modify a field dependency of an angular irradiance distribution in a field, which is illuminated in the mask plane by the illumination system. The modulator includes a plurality of modulator units, wherein each modulator unit is associated with at least one (preferably only one) of the light beams and is arranged at a position in front of the condenser such that only the associated light beam impinges on the modulator unit. Each modulator unit is furthermore configured to variably redistribute, without blocking any light, a spatial and/or an angular irradiance distribution of the associated light beam. The illumination system further includes a control device which is configured to control the modulator units in such a manner that at least one modulator unit redistributes the spatial and/or the angular irradiance distribution of an associated light beam, if the control device receives an input command that the field dependency of the angular irradiance distribution in the mask plane shall be modified.

The disclosure thus departs from the conventional approach of attempting to produce at each point of the illuminated field in the mask plane the same well-defined angular irradiance distribution, i.e. to reduce the field dependency of the angular irradiance distribution to very small tolerable values. Instead, the disclosure seeks to provide an illumination system which makes it possible to enable an operator of the apparatus to quickly change the field dependency of the angular irradiance distribution in the mask plane. This makes it possible to selectively illuminate different portions of the illuminated field with different angular irradiance distributions. If these distributions are specifically adapted to the circuit pattern which is illuminated in these portions, the pattern will be more accurately transferred to the photoresist or another type of light sensitive surface.

However, the disclosure may also be useful for applications in which it is not desired to illuminate different portions of the mask with different illumination settings. The ability to quickly modify the field dependency of the angular irradiance distribution at mask level can then be used to reduce the field dependency very effectively even in cases in which the field dependency varies in time and thus cannot be reduced with fixed optical elements arranged in the optical channels of the optical integrator.

In one embodiment the modulator is configured such that a first angular irradiance distribution is produced at a first portion of the illuminated field and a second angular irradiance distribution, which is distinct from the first angular irradiance distribution, is produced at a second portion of the illuminated field.

Particularly in apparatus of the scanner type, in which the mask is moved along a scan direction during exposure of the photoresist, the first and the second portions may be formed by lines extending along the scan direction. The first portion may adjoin one end of the illuminated field and the second portion may adjoin an opposite end of the illuminated field. In the case of an apparatus of the scanner type the one end and the opposite end may delimit the illuminated field along a direction which is perpendicular to a scan direction.

In other embodiments the first portion is a two-dimensional area in which the first angular irradiance distribution is uniform, and also the second portion is a two-dimensional area in which the second angular irradiance distribution is uniform.

If the apparatus is of the scanner type, the illuminated field usually has a long dimension along an X direction and a short dimension along a Y direction which is perpendicular to the X direction and corresponds to a scan direction of the apparatus. Then the first portion may have at least one Y coordinate, but no X coordinate, in common with the second portion. In other words, the two portions are arranged side by side along the X direction, or possibly displaced along the Y direction, but do not have a point in common which lies on a line extending parallel to the Y direction.

In some embodiments it is even possible to vary the angular irradiance distribution so quickly that the angular irradiance distribution changes while the mask is projected onto the light sensitive layer in a scanning operation. Then the first and the second portions formed by two-dimensional areas may be arranged one behind the other along the scan direction Y so that the two portions may also have an X coordinate in common.

Generally the first and the second angular irradiance distributions of the two portions may be associated with illumination settings taken from the group consisting of: Conventional illumination setting, angular illumination setting, dipole illumination setting and n-pole illumination setting with $n \geq 4$.

In other embodiments each modulator unit is arranged in a raster field plane that is located, in a direction of light propagation, in front of the array of optical raster elements. Each modulator unit is configured to variably redistribute, without blocking any light, the spatial irradiance distribution of the associated light beam in the raster field plane.

This exploits the fact that the raster field planes are optically conjugated to the common field plane, and consequently any spatial redistribution of the associated light beam in a raster field plane directly translates into a redistributed spatial irradiance distribution in the common field plane. Since each modulator unit is associated with a particular light beam which propagates towards the common field plane from a direction that is determined by the position of the associated optical raster element, the field dependency of the angular irradiance distribution changes if a modulator unit changes the spatial irradiance distribution that is produced by the associated light beam in the common field plane.

Generally the raster field planes associated with the optical raster elements will be coplanar. However, the raster field planes may also be displaced along an optical axis or tilted if the optical raster elements have different optical properties.

In some embodiments each modulator unit is configured to shift an area in the raster field plane, which is illuminated by the light beam associated with the modulator unit, along a direction which is perpendicular to an optical axis of the illumination system. Then the illuminated field in the common field plane also shifts by an amount which is proportional to the shift of the area in the raster field plane. In an apparatus of the scanning type, the shift direction may be equal to the X direction. In this context it should be noted that usually the raster field plane is not a plane in the mathematical sense, but is optically defined and may therefore have a certain "thickness". Thus an oblique shift within such a "thick" field plane is still considered as a shift perpendicular to the optical axis.

The shift of the illuminated area may be achieved by the modulator units without changing the angular irradiance distribution of the associated light beams. Then the angular irradiance distribution produced by a particular light beam in the common field plane is exclusively determined by the position of the associated optical raster element, but substantially independent from the location of the illuminated area in the raster field plane associated with the light beam.

Configuring a modulator unit such that it is capable of variably redistributing the spatial irradiance distribution of the associated light beam in the raster field plane usually requires that there is some space available in the raster field plane that can be used to accommodate optical components, actuators and other mechanical components that are used for this purpose. This implies that the illuminated portions of the raster field planes have to be separated by gaps.

An optical integrator that produces raster field planes wherein the illuminated portions are separated by gaps may include, counted in a direction of light propagation, a first, a second and a third array of optical raster elements, wherein the raster field planes are located between the second and the third array of optical raster elements. Such an optical integrator is described in the unpublished German patent application DE 10 2009 045 219 which has been filed on Sep. 30, 2009 and which is assigned to the applicant of the present application.

In other embodiments each modulator unit is arranged in or in close proximity to a pupil plane that is located, in the direction of light propagation, behind the array of optical raster elements. Each modulator unit is configured to variably redistribute, without blocking any light, the angular irradiance distribution of the associated light beam in the pupil plane. This exploits the fact that the angular irradiance distribution in the pupil plane translates into a spatial irradiance distribution in the common field plane which is Fourier related to the pupil plane.

In this context each modulator may be configured to tilt the light beam associated with the modulator unit about a tilt axis which is perpendicular to an optical axis. This will result in a shift of the spatial irradiance distribution in the common field plane.

In the case of a scanning apparatus the tilt axis may be equal to an Y direction which is equal to the scan direction.

Irrespective of the position of the modulator units each modulator unit may include an optical element that is configured to change the propagation direction of the associated light beam impinging on it. Furthermore, each modulator unit may include an actuator that is coupled to the optical element and is configured to change the position and/or orientation of the optical element in response to a control signal received from the control device.

In this context a parallel shift of a light beam is also considered as a change of the propagation direction.

The optical element may be a refractive optical element, in particular a lens, a prism or a Fresnel prism, or a diffractive optical element.

Generally the actuator may be configured to displace the optical element along a direction that is inclined with respect to (and preferably perpendicular to) an optical axis of the illumination system.

In other embodiments the actuator is configured to rotate the optical element around a rotational axis that is inclined with respect to (and preferably perpendicular to) an optical axis of the illumination system.

In some embodiments the modulator is configured such that the angular irradiance distribution discontinuously varies over the illuminated field. This is particularly useful if masks shall be illuminated that contain different pattern areas each involving uniform, but different angular irradiance distributions.

In other embodiments the modulator is configured such that the angular irradiance distribution continuously varies over at least a portion of the illuminated field. This may be advantageous, for example, if the density, the dimensions and/or the orientation of the pattern features are not uniform within larger pattern areas, but also vary in an approximately continuous manner over at least a portion of the illuminated field.

In the latter case the first portion may be a first line where the first angular irradiance distribution is uniform. The second portion may be a second line where the second angular irradiance distribution is uniform. The modulator is then configured such that the first angular irradiance distribution continuously transforms into the second irradiance distribution within an area arranged between the first line and the second line.

For producing continuously varying irradiance distributions a modulator unit may be used that is configured to change an irradiance distribution within an area in the raster field plane, which is illuminated by the light beam associated with the modulator unit, without shifting it. In other words, the size, geometry and position of the illuminated area in the raster field plane is not changed by the modulator unit, but the irradiance distribution within this area does change in response to a control signal received from the control device.

In the case of a continuously varying angular irradiance distribution each modulator unit may be configured to transform the irradiance distribution from a uniform irradiance distribution into a modified irradiance distribution which linearly increases or decreases along a reference direction. In the case of a scanning apparatus this direction may be equal to an X direction which is perpendicular to a scan direction Y.

Subject of the disclosure is also a method of operating a microlithographic projection exposure apparatus including the following steps:

a) providing a microlithographic projection exposure apparatus including an illumination system and a projection objective;
b) providing a mask to be illuminated by the illumination system;
c) defining a first desired angular irradiance distribution and a second desired angular irradiance distribution which is distinct from the first angular irradiance distribution;
d) illuminating the mask in such a way that the first angular irradiance distribution is obtained at a first portion of the mask and the second angular irradiance distribution is obtained at a second portion of the mask that is distinct from the first portion.

The first and the second angular irradiance distributions may be associated with illumination settings taken from the group consisting of: Conventional illumination setting, angular illumination setting, dipole illumination setting, n-pole illumination setting with n≥4.

The first portion may be a two-dimensional area in which the first angular irradiance distribution is uniform. The second portion may be also a two-dimensional area in which the second angular irradiance distribution is uniform. Feature patterns contained in the mask may be different at the first portion and the second portion.

Alternatively, the first portion may be a first line where the first angular irradiance distribution is uniform, and the second portion may be a second line where the second angular irradiance distribution is uniform. The first angular irradiance distribution then continuously transforms into the second angular irradiance distribution within an area arranged between the first line and the second line.

The method may include the step of controlling a modulator contained in the illumination system in such a way that the first and second angular irradiance distributions are obtained.

The method may also include the step of redistributing, without blocking any light, a spatial and/or an angular irradiance distribution of light beams that are associated with optical raster elements contained in the illumination system.

The angular irradiance distribution may be changed while the mask is projected onto a light sensitive surface by the projection objective.

The present disclosure is generally applicable also to EUV illumination systems in which the optical raster elements are mirrors.

DEFINITIONS

The term "field plane" is used herein to denote a plane that is optically conjugate to the mask plane.

The term "pupil plane" is used herein to denote a plane in which marginal rays passing through different points in the mask plane intersect.

The term "uniform" is used herein to denote a property that does not depend on the position.

The term "light" is used herein to denote any electromagnetic radiation, in particular visible light, UV, DUV, VUV and EUV light and X-rays.

The term "light ray" is used herein to denote light whose path of propagation can be described by a line.

The term "light bundle" is used herein to denote a plurality of light rays that have a common origin in a field plane.

The term "light beam" is used herein to denote light that passes through a particular lens or another optical element.

The term "orientation" is used herein to denote the angular alignment of a body in the three-dimensional space. The orientation is usually indicated by a set of three angles.

The term "position" is used herein to denote the location of a reference point of a body in the three-dimensional space. The position is usually indicated by a set of three Cartesian coordinates. The orientation and the position therefore fully describe the placement of a body in the three-dimensional space.

The term "optical raster element" is used herein to denote any optical element, for example a lens, a prism or a diffractive optical element, which is arranged, together with other optical raster elements, so that a plurality of adjacent optical channels are produced or maintained.

The term "optical integrator" is used herein to denote an optical system that increases the product NA·a, wherein NA is the numerical aperture and a is the illuminated field area.

The term "condenser" is used herein to denote an optical element or an optical system that establishes (at least approximately) a Fourier relationship between two planes, for example a field plane and a pupil plane.

The term "conjugated plane" is used herein to denote planes between which an imaging relationship is established. More information relating to the concept of conjugate planes are described in an essay E. Delano entitled: "First-order Design and the y, $\bar{y}$ Diagram", Applied Optics, 1963, vol. 2, no. 12, pages 1251-1256.

The term "field dependency" is used herein to denote any functional dependency of a physical quantity from the position in a field plane.

The term "spatial irradiance distribution" is used herein to denote how the total irradiance varies over a real or imaginary surface on which light impinges. Usually the spatial irradiance distribution can be described by a function $I_s(x, y)$, with x, y being spatial coordinates of a point in the surface. If applied to a field plane, the spatial irradiance distribution integrates the irradiances produced by a plurality of light bundles.

The term "angular irradiance distribution" is used herein to denote how the irradiance of a light bundle varies depending on the angles of the light rays that constitute the light bundle. Usually the angular irradiance distribution can be described by a function $I_a(\alpha, \beta)$, with $\alpha, \beta$ being angular coordinates describing the directions of the light rays. If the angular irradiance distribution has a field dependency, $I_a$ will be also a function of field coordinates, i.e. $I_a=I_a(\alpha, \beta, x, y)$.

BRIEF DESCRIPTION OF THE DRAWINGS

Various features and advantages of the present disclosure may be more readily understood with reference to the following detailed description taken in conjunction with the accompanying drawings in which:

FIG. 27 is a perspective view of the optical element including two of the optical members as shown in FIG. 26;

FIGS. 28 to 30 are front views, along the Z direction, of the optical element shown in FIG. 27 which is arranged in different X positions.

DESCRIPTION OF THE PREFERRED EMBODIMENTS

I.

General Construction of Projection Exposure Apparatus

Figure 1:
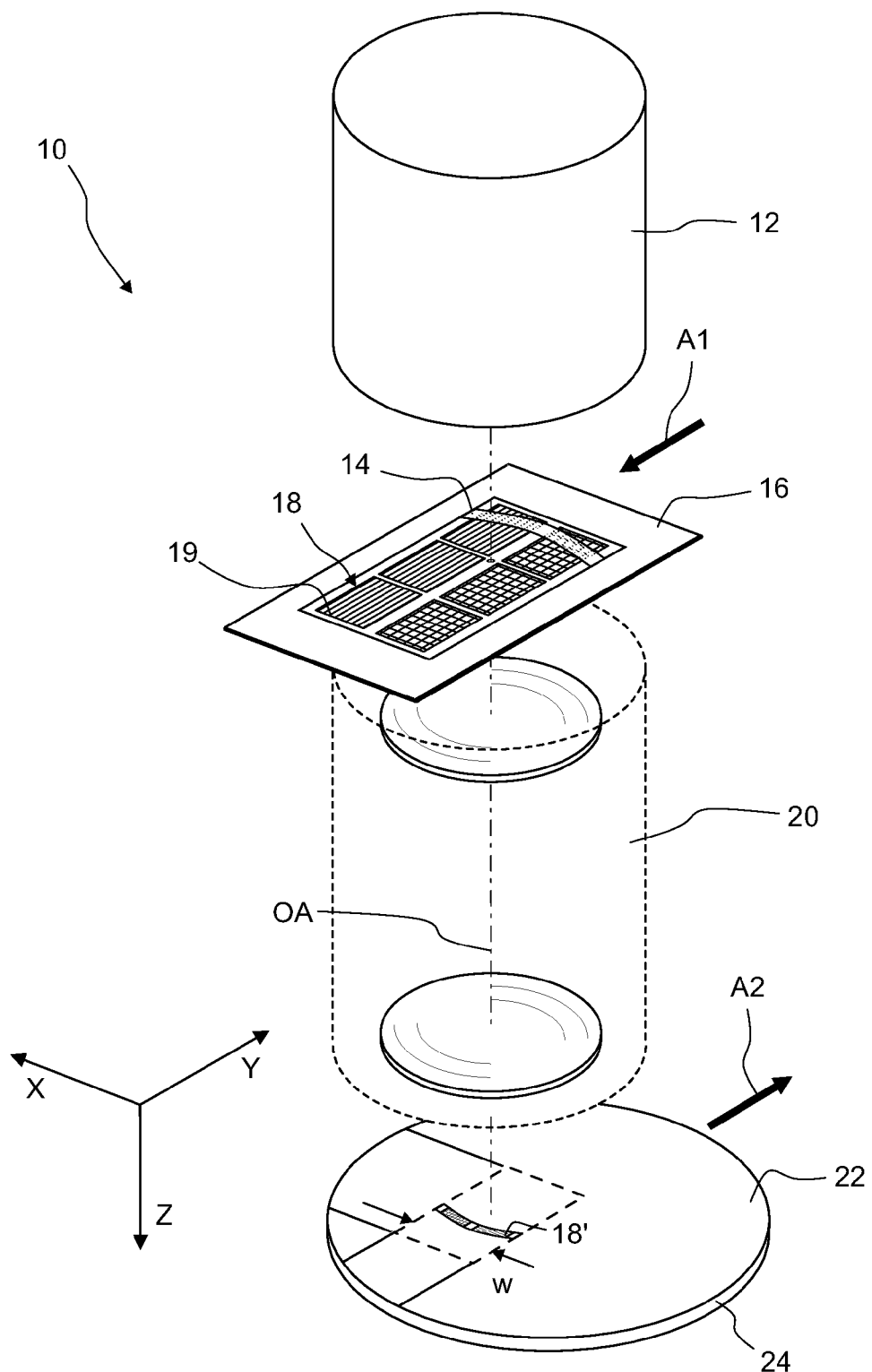
FIG. 1 is a schematic perspective view of a projection exposure apparatus in accordance with one embodiment of the present disclosure.

FIG. 1 is a perspective and highly simplified view of a projection exposure apparatus 10 in accordance with the present disclosure. The apparatus 10 includes an illumination system 12 which produces a projection light beam. The latter illuminates a field 14 on a mask 16 containing a pattern 18 formed by a plurality of small features 19 that are schematically indicated in FIG. 1 as thin lines. In this embodiment the illuminated field 14 has the shape of a ring segment which does not contain an optical axis OA of the apparatus. However, other shapes of the illuminated field 14, for example rectangles, are contemplated as well.

A projection objective 20 images the pattern 18 within the illuminated field 14 onto a light sensitive layer 22, for example a photoresist, which is supported by a substrate 24. The substrate 24, which may be formed by a silicon wafer, is arranged on a wafer stage (not shown) such that a top surface of the light sensitive layer 22 is precisely located in an image plane of the projection objective 20. The mask 16 is positioned via a mask stage (not shown) in an object plane of the projection objective 20. Since the latter has a magnification β with |β|<1, a minified image 18' of the pattern 18 within the illuminated field 14 is projected onto the light sensitive layer 22.

During the projection the mask 16 and the substrate 24 move along a scan direction which corresponds to the Y direction indicated in FIG. 1. The illuminated field 14 then scans over the mask 16 so that patterned areas larger than the illuminated field 14 can be continuously imaged. The ratio between the velocities of the substrate 24 and the mask 16 is equal to the magnification β of the projection objective 20. If the projection objective 20 inverts the image (β<0), the mask 16 and the substrate 24 move in opposite directions, as this is indicated in FIG. 1 by arrows A1 and A2. However, the present disclosure may also be used in stepper tools in which the mask 16 and the substrate 24 do not move during projection of the mask.

II.

Multiple Illumination Setting

Figure 2:
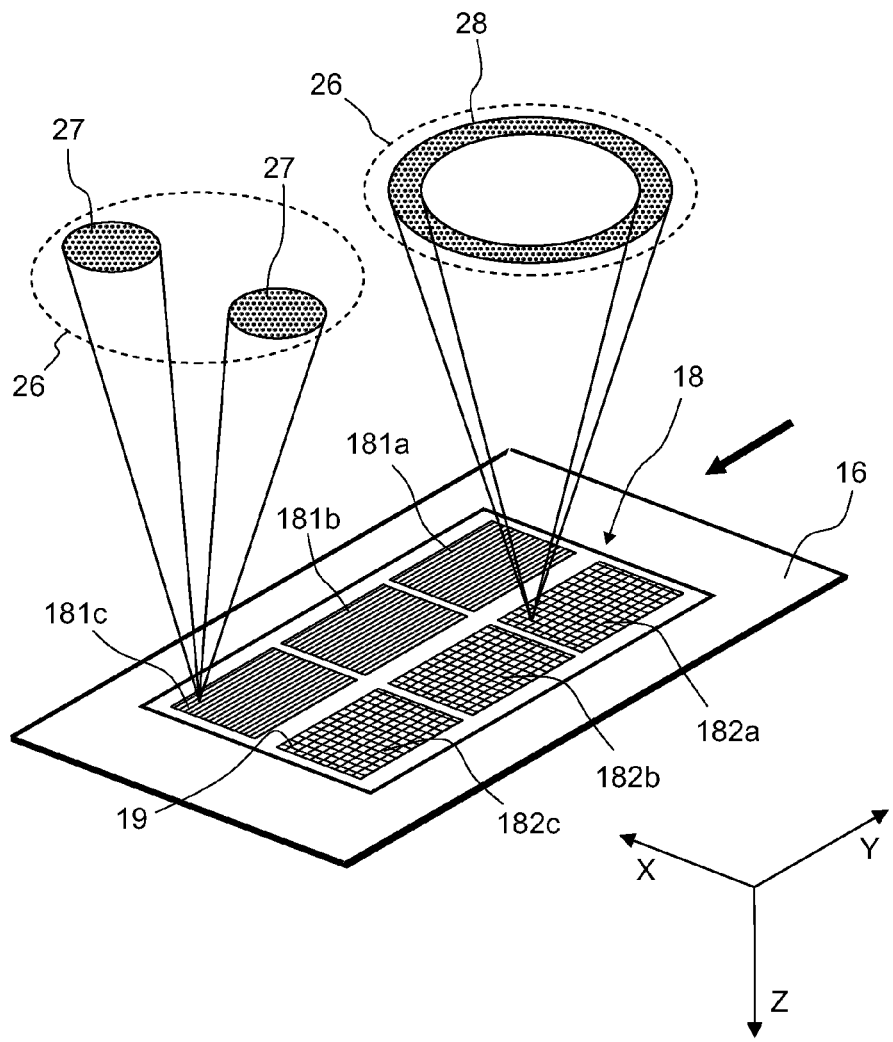
FIG. 2 is an enlarged perspective view of the mask to be projected by the projection exposure apparatus shown in FIG. 1.

FIG. 2 is an enlarged perspective view of the mask 16. The pattern 18 on this mask includes three first identical pattern areas 181a, 181b, 181c which are arranged one behind the other along the Y direction. For the sake of simplicity it is assumed that the features 19 of the first pattern areas 181a, 181b, 181c are straight lines extending along the Y direction. The pattern 18 further includes three identical second pattern areas 182a, 182b, 182c which are also arranged one behind the other along the Y direction, but laterally displaced from the first pattern areas 181a, 181b, 181c so that the first pattern areas 181a, 181b, 181c and the second pattern areas 182a, 182b, 182c have no common X coordinate.

It is assumed that the second pattern areas 182a, 182b, 182c contain features 19 extending along the X direction and features 19 extending along the Y direction.

The mask 16 shown in FIG. 2 is assumed to be used in a manufacturing step in which two different dies are exposed simultaneously and will be subjected to the same subsequent manufacturing steps such as etching. The dies are small enough so that they can be positioned next to each other within the image field of the projection objective 20 having a width w along the X direction, as it is shown in FIG. 1. Within one complete scanning cycle three dies of a first type associated with the first pattern areas 181a, 181b, 181c and three dies of a second type associated with the second pattern areas 182a, 182b, 182c can be exposed. Then the scanning direction is either reversed or the mask 16 is returned to its original position without any illumination, and a further scanning cycle is performed. In this way two rows of different dies can be exposed simultaneously on the substrate 24.

Generally different patterns require different angular irradiance distributions at mask level if maximum image quality is desired. In this embodiment it is assumed that the features 19 extending along the Y direction are best imaged on the light sensitive layer 22 with an X dipole illumination setting. In FIG. 2 the pupil 26 associated with a light bundle that converges towards a field point located in one of the first pattern areas is indicated by a broken circle. In the pupil 26 two poles 27, which are spaced apart along the X direction, represent directions from which light propagates towards the field point. Since the patterns are assumed to be uniform over the first pattern areas 181a, 181b, 181c, thus this X dipole illumination setting is produced at each field point in the first pattern areas 181a, 181b, 181c.

The second pattern areas 182a, 182b, 182c, which are associated with the second type of die, contain features extending along the X direction and features 19 extending along the Y direction. For these features 19 it is assumed that an annular illumination setting results in the best image quality. FIG. 2 indicates an annulus 28 which is illuminated in the pupil 26 associated with a light bundle that converges towards a field point in one of the second pattern areas 182a, 182b, 182c. Again, this annular illumination setting shall be produced at each field point in the second pattern areas 182a, 182b, 182c.

This implies that the illumination system 12 is capable of producing two different illumination settings simultaneously and side by side within the illuminated field 14. In the following the structure of the illumination system 12 which is capable of performing this task will be described in more detail with reference to FIGS. 3 to 13.

III.

General Construction of Illumination System

Figure 3:
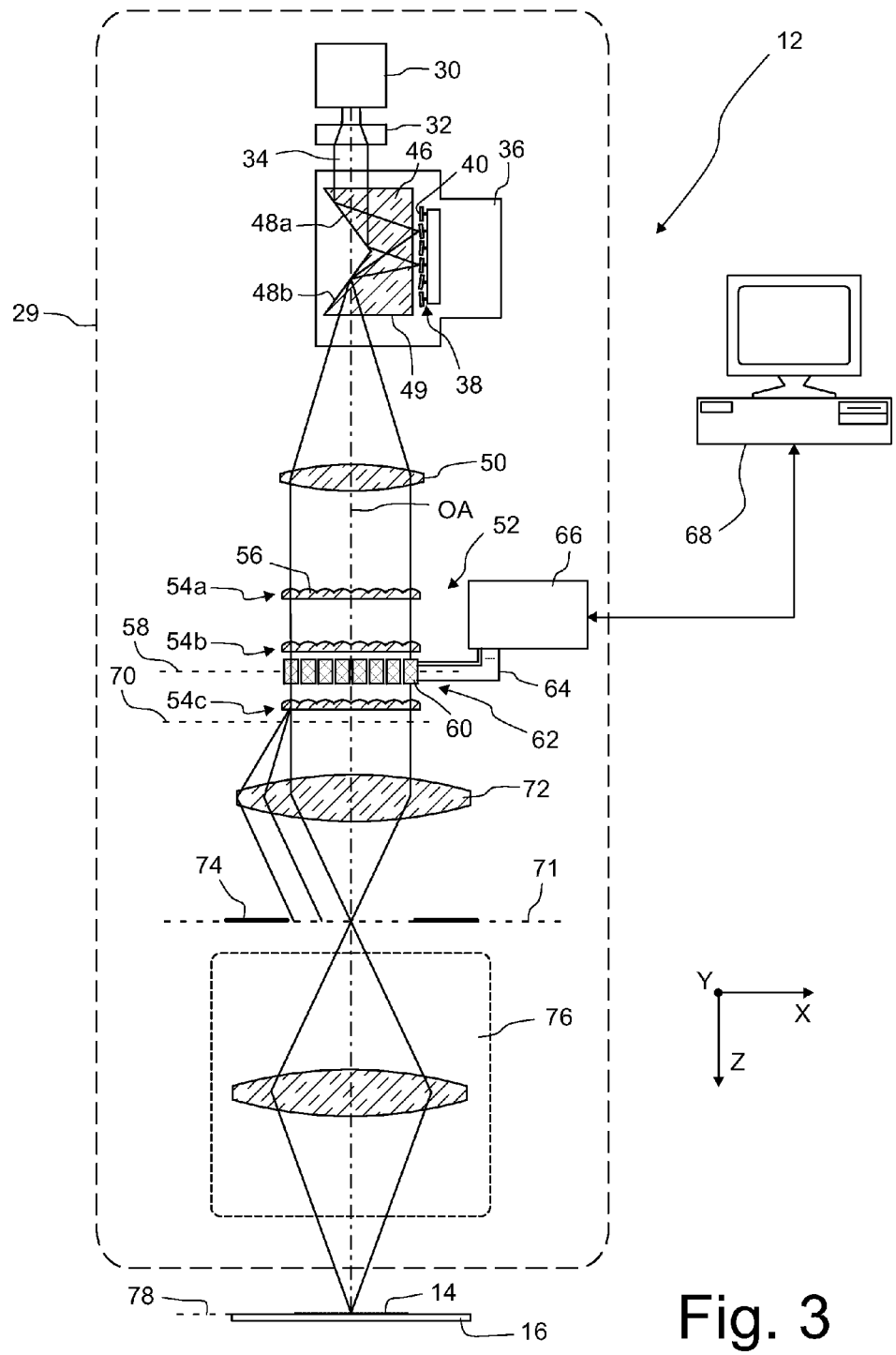
FIG. 3 is a meridional section through an illumination system being part of the apparatus shown in FIG. 1.

FIG. 3 is a meridional section through the illumination system 12 shown in FIG. 1. For the sake of clarity, the illustration of FIG. 3 is considerably simplified and not to scale. This particularly implies that different optical units are represented by one or very few optical elements only. In reality, these units may include significantly more lenses and other optical elements.

The illumination system 12 includes a housing 29 and a light source 30 that is, in the embodiment shown, realized as an excimer laser. The light source 30 emits projection light having a wavelength of about 193 nm. Other types of light sources 30 and other wavelengths, for example 248 nm or 157 nm, are also contemplated.

In the embodiment shown, the projection light emitted by the light source 30 enters a beam expansion unit 32 in which the light beam is expanded. The beam expansion unit 32 may include several lenses or may be realized as a mirror arrangement, for example. The projection light emerges from the beam expansion unit 32 as an almost collimated projection light beam 34.

Figure 4:
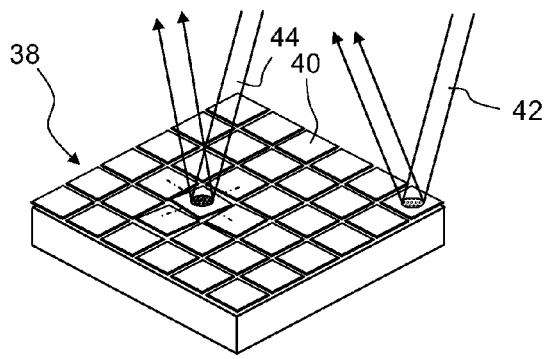
FIG. 4 is a perspective view of a mirror array contained in the illumination system shown in FIG. 3.

The projection light beam 34 then enters a pupil defining unit 36 that is used to produce variable spatial irradiance distributions in a subsequent pupil plane. To this end the pupil defining unit 36 includes an array 38 of microscopic mirrors 40 that can be tilted individually about two orthogonal axes with the help of actuators. FIG. 4 is a perspective view of the array 38 illustrating how two parallel light beams 42, 44 are reflected into different directions depending on the tilting angles of the mirrors 40 on which the light beams 42, 44 impinge. In FIGS. 3 and 4 the array 38 includes only 66 mirrors 40; in reality the array 38 may include several hundreds or even several thousands mirrors 40.

The pupil defining unit 36 further includes a prism 46 having a first plane surface 48a and a second plane surface 48b that are both inclined with respect to an optical axis OA of the illumination system 12. At these inclined surfaces 48a, 48b impinging light is reflected by total internal reflection. The first surface 48a reflects the impinging light towards the mirrors 40 of the mirror array 38, and the second surface 48b directs the light reflected from the mirrors 40 towards an exit surface 49 of the prism 46. The angular irradiance distribution of the light emerging from the exit surface 49 can thus be varied by individually tilting the mirrors 40 of the array 38. More details with regard to the pupil defining unit 38 can be gleaned from US 2009/0116093 A1.

The angular irradiance distribution produced by the pupil defining unit 36 is transformed into a spatial irradiance distribution with the help of a first condenser 50 which directs the impinging light towards an optical integrator 52. In this embodiment the optical integrator 52 includes a first array 54a, a second array 54b and a third array 54c of optical raster elements 56.

Figure 5:
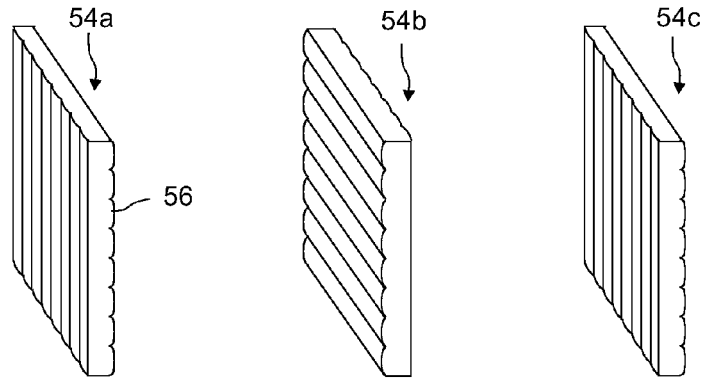
FIG. 5 is a perspective view of three arrays of optical raster elements contained in the illumination system shown in FIG. 3.

FIG. 5 is a perspective view of the three arrays 54a, 54b, 54c. Each array includes, on a front and a rear side of a support plate, a sub-array of optical raster elements 56 which are formed by parallel cylinder lenses that extend along the X or Y direction. The use of cylinder lenses is often advantageous particularly in those cases in which the refractive power of the optical raster elements 56 shall be different along the X and the Y direction.

Figures 6, 7:
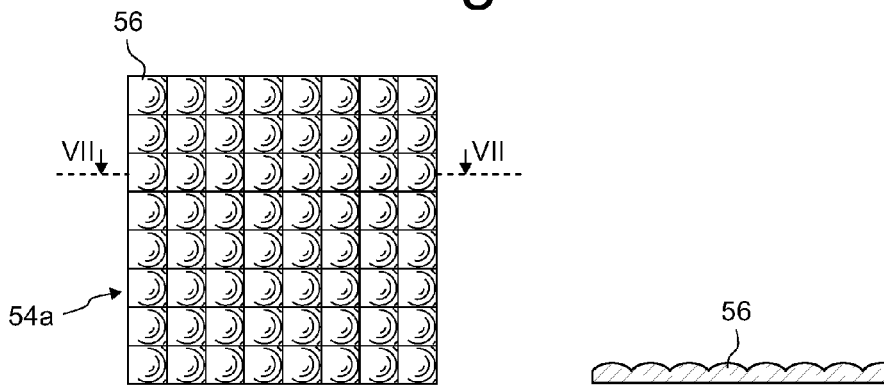
FIG. 6 is a top view on an array of optical raster elements that may alternatively be contained in the illumination system shown in FIG. 3.
FIG. 7 is a sectional view along line VII-VII of the array shown in FIG. 6.

FIGS. 6 and 7 show the array 54a according to an alternative embodiment in a top view and a sectional view along line VII-VII, respectively. Here the optical raster elements 56 are formed by plano-convex lenses having a square contour. The other arrays 54b, 54c differ from the array 54a only with regard to the curvature of the convex surface of the optical raster elements 56.

Referring again to FIG. 3, the optical raster elements 56 of the first, second and third array 54a, 54b and 54c, respectively, are arranged one behind the other in such a way that one optical raster element 56 of each array is exactly associated with one optical raster element 56 of the other two arrays. The three optical raster elements which are associated with each other are aligned along a common axis and define an optical channel. Within the optical integrator 52 a light beam which propagates in one optical channel does not cross or superimpose with light beams propagating in other optical channels. In other words, the optical channels which are associated with the optical raster elements 56 are optically isolated from each other.

Between the second array 54b and the third array 54c a raster field plane 58 is located in which modulator units 60 of a modulator 62 are arranged. The modulator units 60 are connected via control lines 64 to a control device 66 which is, in turn, connected to a central apparatus control 68 which controls the overall operation of the projection exposure apparatus 10.

In this embodiment a pupil plane 70 of the illumination system 12 is located behind the third array 54c (it may also be arranged in front of it). A second condenser 72 establishes a Fourier relationship between the pupil plane 70 and a field stop plane 71 in which an adjustable field stop 74 is arranged. The field stop plane 71 is optically conjugated to the raster field plane 58 in which the modulator units 60 are arranged.

This means that an area in the raster field plane 58 within an optical channel is imaged on the field stop plane 71 by the associated optical raster element 56 of the third array 54c and the second condenser 72. The images of the illuminated areas within the optical channels superimpose in the field stop plane 71, and this results in a very homogenous illumination of the field stop plane 71. This process is often described by identifying the illuminated areas in the optical channels with secondary light sources that commonly illuminate the field stop plane 71.

The field stop plane 71 is imaged by a field stop objective 76 onto a mask plane 78 in which the mask 16 is arranged with the help of a mask stage (not shown). The adjustable field stop 74 is also imaged on the mask plane 78 and defines at least the short lateral sides of the illuminated field 14 extending along the scan direction Y.

IV.

Modulator

Figure 8:
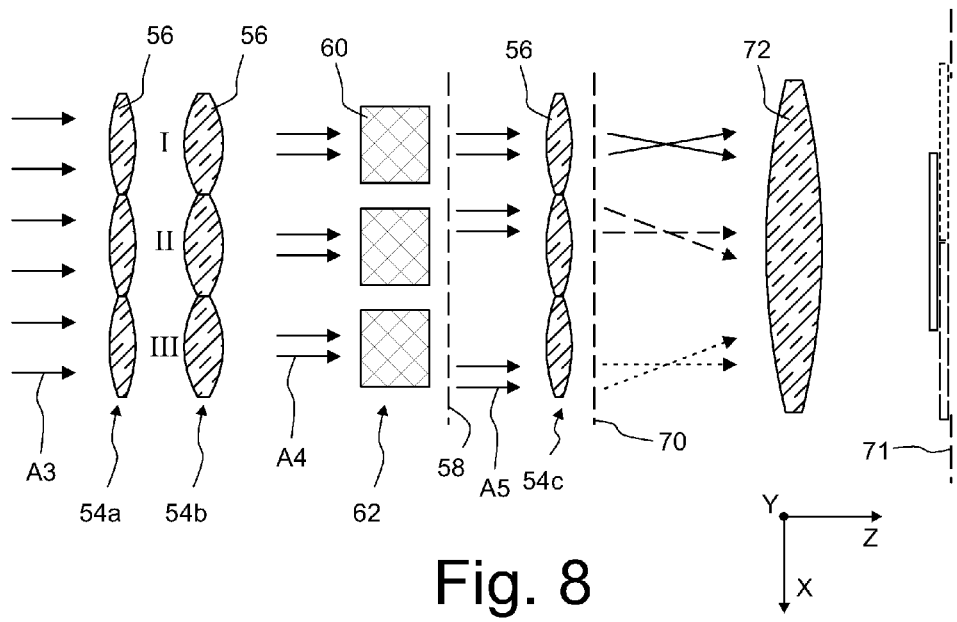
FIG. 8 is a schematic meridional section through three adjacent optical channels of an optical integrator contained in the illumination system shown in FIG. 3.

The function of the modulator 62 will be explained in the following with reference to FIG. 8 which is a schematic meridional section through three adjacent optical channels I, II and III formed in the optical integrator 52. The projection light impinging on the optical integrator 52 has a low divergence. For the sake of simplicity this divergence is neglected in this discussion so that the light impinging on the first array 54a of the optical raster element 56 is assumed to be collimated. It is further assumed that the three optical raster elements 56 of the optical integrator 52 are uniformly illuminated, as it is indicated in FIG. 8 by arrows A3. For the sake of simplicity the optical raster elements 56 which are formed where orthogonal cylinder lenses intersect are represented as biconvex lenses.

The optical raster elements 56 of the first two arrays 54a, 54b have the effect that the width of the light beams associated with the individual optical channels I, II and III is reduced in the X direction. A reduction may also take place along the Y direction, but possibly with a different reduction factor. The areas illuminated on the modulator units 60 have a rectangular shape and are, at least along the X direction, separated by gaps that are represented in FIG. 8 by the blank space between adjacent pairs of arrows A4.

The modulator units 60 have the effect that these illuminated areas in the raster field plane 58 are laterally shifted along the X direction. This lateral shift is represented in FIG. 8 by pairs of arrows A5 for the optical channels II and III; in the upper optical channel I the modulator unit 60 is in a neutral state so that the irradiance distribution is not shifted.

The optical raster element 56 of the third array 54c and the second condenser 72 image the irradiance distributions in the raster field planes 58 on the field stop plane 71, as it has already been mentioned above. The irradiance distribution in the field stop plane 71 produced exclusively by the upper optical channel I is indicated in FIG. 8 by a rectangle drawn in solid lines. This irradiance distribution is centered in the field stop plane 71, since the modulator unit 60 has not shifted the irradiance distribution at its entrance side.

However, the irradiance distributions in the field stop plane 71 produced by the middle and the lower optical channels II and III, which are indicated in FIG. 8 with broken and dotted lines, respectively, are now laterally shifted along the X direction. This is simply a result of the optical conjugation between the raster field plane 58 and the field stop plane 71 in each optical channel.

The angular irradiance distribution, which is produced in the field stop plane 71 by each of the optical channels I, II and III, depends on the position of the optical channel in the pupil plane 70. The greater the distance between the optical axis of the second condenser 72 and the position of an optical channel is, the larger will be the illumination angle produced by the optical channel. Thus the three optical channels I, II and III are able to produce different illuminated fields having different angular irradiance distributions.

Figure 9:
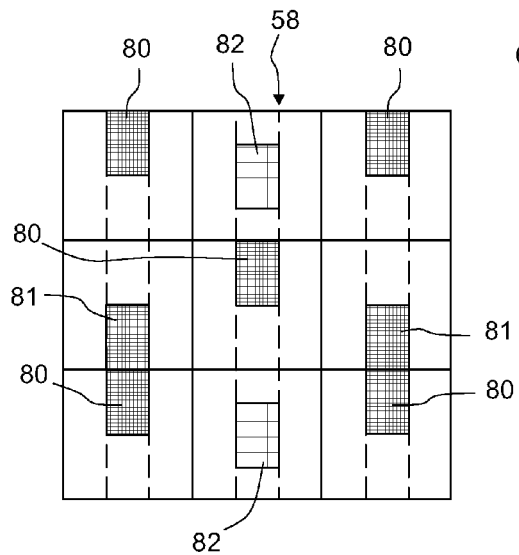
FIG. 9 is a top view on a 3×3 channel optical integrator illustrating an irradiance distribution in a raster field plane.

This will be explained in the following in more detail with reference to FIGS. 9 and 10. FIG. 9 is a top view of the raster field plane 58 of an optical integrator 52 in which only 3×3 optical channels are provided. The dark areas in FIG. 9 indicate areas in the raster field plane 58 which are illuminated by projection light. It can be seen in FIG. 9 that five areas 80 are shifted along the −X and two areas 81 are shifted along the +X direction as a result of the operation of the modulator units 60 associated with the respective optical channels. Two areas 82 are not illuminated, i.e. the pupil defining unit 36 does not direct any light towards the optical raster elements 56 associated with these areas 82.

As it has been explained above, the lateral shift of the areas 80 illustrated in FIG. 9 has the effect that also the illuminated area in the field stop plane 71, and consequently the mask plane 78, is shifted. By suitably selecting the dimensions of the areas 80 it can be achieved that either the left half or the right half of the field 14 on the mask 16 is illuminated by the respective optical channel.

Figure 10:
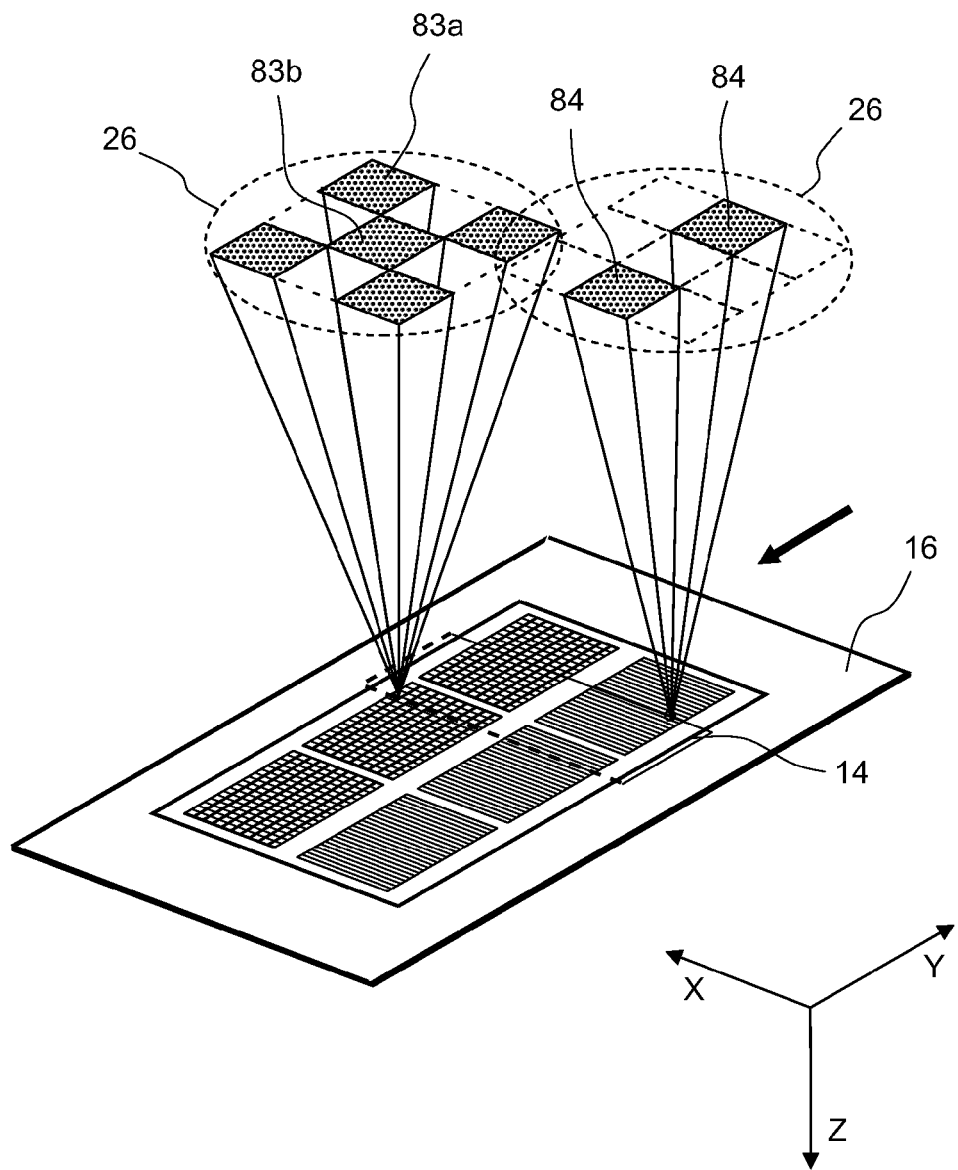
FIG. 10 is a perspective view similar to FIG. 2 on a mask illustrating the different angular irradiance distributions obtained for different pattern areas on the mask.

FIG. 10 is a perspective view on the mask 16 and illustrates the illumination conditions for this simplified example. It can be seen that on one half of the illuminated field 14 an angular irradiance distribution is obtained which resembles a C-quad illumination setting including five poles, namely four outer poles 83a and a central pole 83b. These five poles correspond to the five illuminated areas 80 in shown in FIG. 9.

On the other half of the field 14 an angular irradiance distribution is obtained which resembles a Y dipole illumination setting including two poles 84. These two poles 84 correspond to the two illuminated areas 81 shown in FIG. 9.

From the foregoing it should have become clear that almost any arbitrary illumination setting can be produced on the two halves of the illuminated field 14 if the number of optical channels is sufficiently high, provided the pupil defining unit 36 is also able to produce a desired irradiance distribution on the optical integrator 52. In the following two different embodiments of the modulator units 60 are described with reference to FIGS. 11 and 12.

Figure 11:
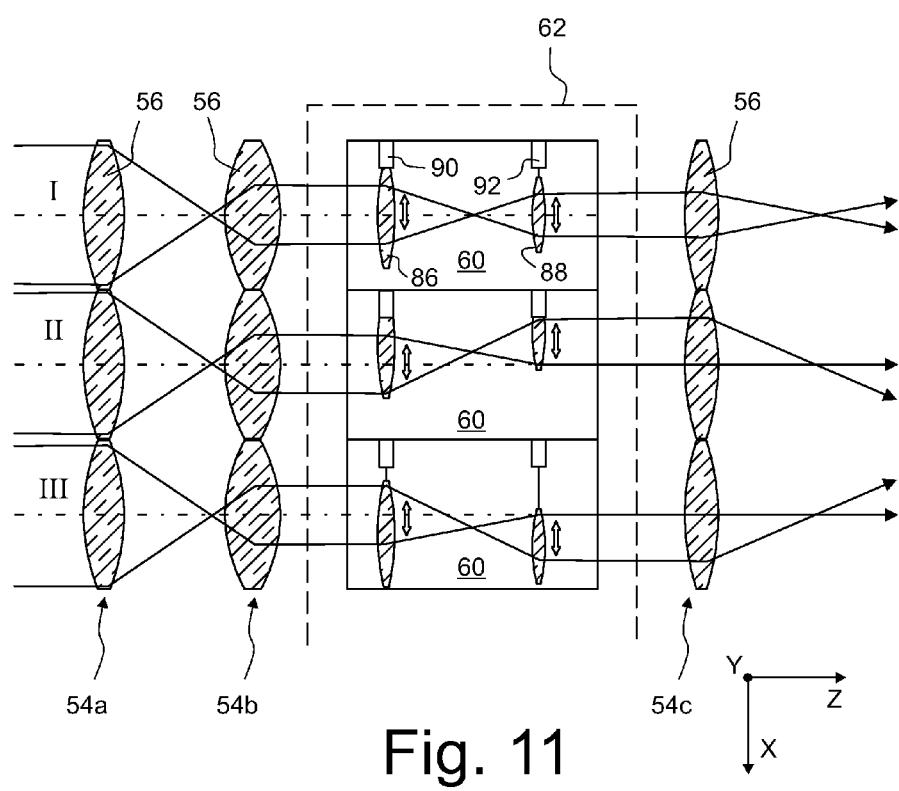
FIG. 11 is a schematic meridional section similar to FIG. 8 that additionally shows optical components inside the modulator unit shown in FIG. 8.

In the embodiment shown in FIG. 11 the modulator units 60 of the modulator 62 each include two cylinder lenses 86, 88 that can be individually displaced along the X direction, as it is indicated by double arrows in FIG. 11. By decentering the cylinder lenses 86, 88 from the optical axis of the respective optical channel, the light beams associated with the optical channels are laterally displaced. This exploits the fact that a decentered lens has the same effect as a centered lens plus a triangular prism. For displacing the cylinder lenses 86, 88 actuators indicated at 90, 92 are coupled to the cylinder lenses 86, 88. The actuators 90, 92 change the position of the lenses 86, 88 in response to control signals received from the control device 66.

Figure 12:
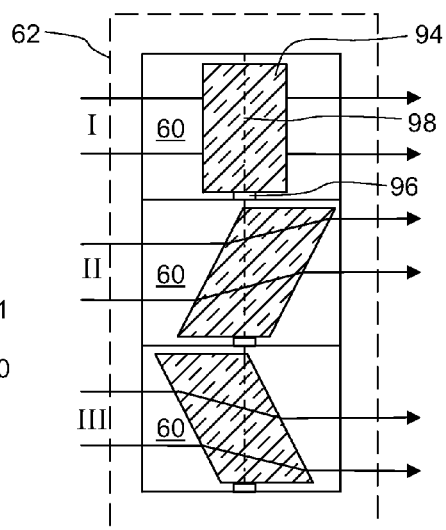
FIG. 12 shows an alternative embodiment of modulator units that may be used in the embodiment shown in FIG. 8.

FIG. 12 shows another embodiment of a modulator 62 in a meridional section. In this embodiment each modulator unit 60 includes a prism 94 having the shape of a parallelepiped. Each prism 94 has two pairs of planar rectangular surfaces and one pair of planar surfaces having a contour of a parallelogram. With the help of actuators indicated at 96 the prisms 94 can be rotated around a rotational axis 98.

In the rotational position shown for the upper optical channel I the prism 94 is in a neutral state in which the light beam passes through two planar surfaces at normal incidence. In the rotational positions shown for the middle and lower optical channel II and III the light beams pass through two inclined planar surface so that the light beams are laterally shifted.

Figure 13:
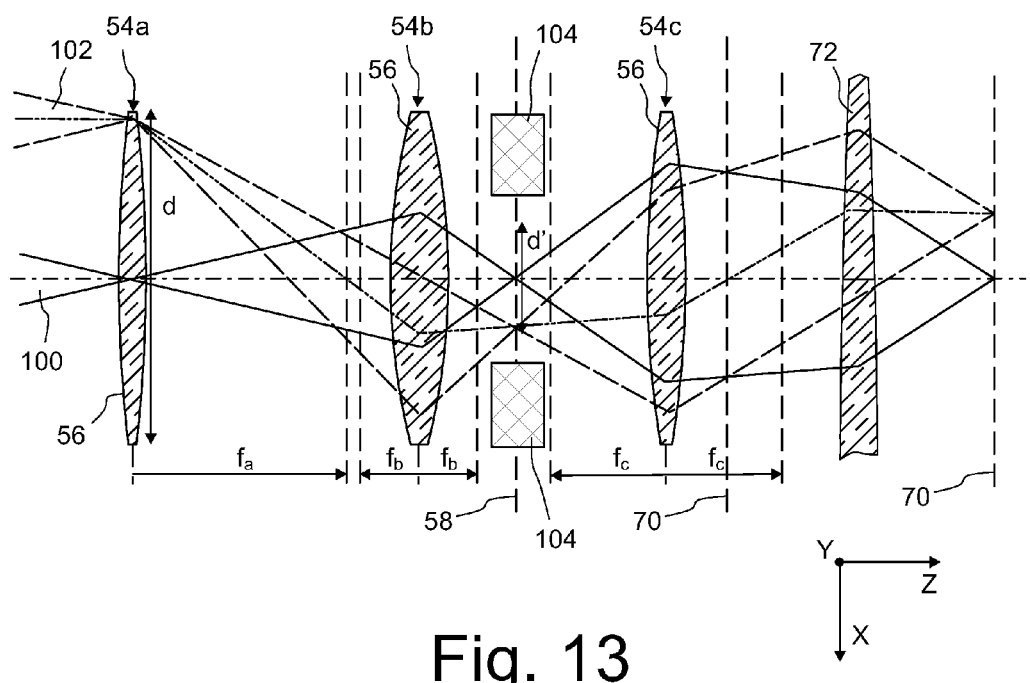
FIG. 13 is a schematic meridional section through the optical integrator of the illumination system shown in FIG. 3 illustrating the focal lengths of the optical raster elements contained therein.

FIG. 13 is a schematic meridional section through one optical channel of the optical integrator 52. In this illustration the ray traces of a central light bundle 100 and a marginal light bundle 102 are shown in solid and broken lines, respectively. The focal lengths of the optical raster elements 56 of the three arrays 54a, 54b and 54c are indicated as $f_a$, $f_b$ and $f_c$. The hatched area 104 in the raster field plane 58 indicates a volume through which no projection light passes and which is thus available for accommodating components such as actuators, support structures or axes of the modulator units 60.

The irradiance distribution on the optical raster element 56 of the first array 54a having a diameter d is imaged at a reduced scale d'/d onto the raster field plane 58 where the diameter is d'. As can be seen from the gap between adjacent focal planes, the optical raster elements 56 are positioned in a slightly defocused manner. This enables adjustments to correct telecentricity errors, for example. More details regarding the optical integrator 52 can be gleaned from the above mentioned unpublished German patent application DE 10 2009 045 219 which has been filed on Sep. 30, 2009 and which is assigned to the applicant of the present application.

V.

Alternative Embodiments

Figure 14:
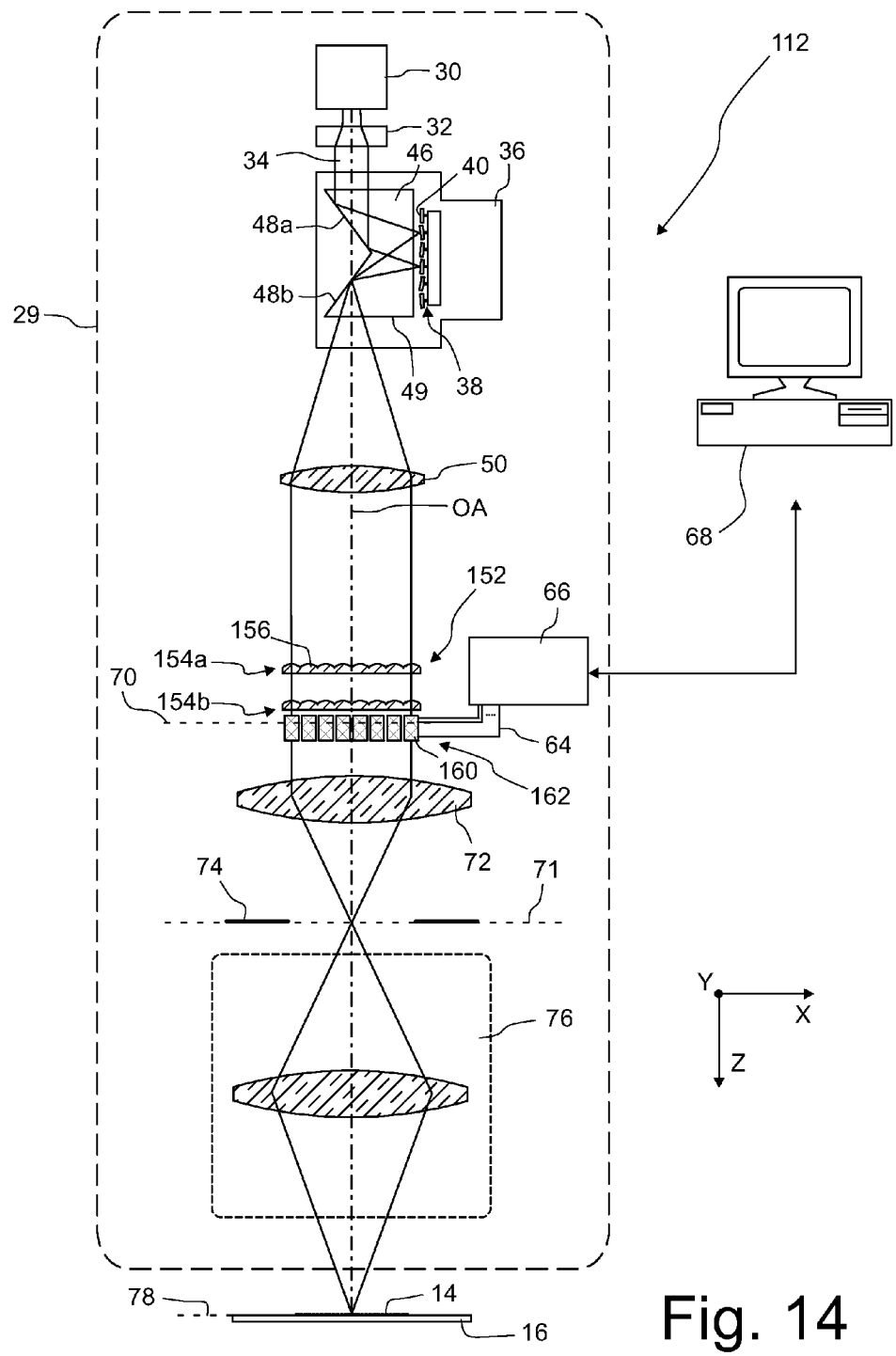
FIG. 14 is a meridional section through an illumination system according to another embodiment in which modulator units are arranged in a pupil plane of the illumination system.

FIG. 14 is a schematic meridional section similar to FIG. 3 through an illumination system 112 according to another embodiment. The optical integrator 152 includes in this embodiment only two arrays 154a, 154b of optical raster elements 156. However, the main difference to the illumination system 12 shown in FIG. 3 is that the modulator 162 including the modulator units 160 is not arranged in the raster field plane 58, but in the pupil plane 70 immediately behind the last array of optical raster elements 156, between the second array 154b and the second condenser 72. Furthermore, the modulator units 160 are configured to variably redistribute, without blocking any light, not the spatial irradiance distribution, but the angular irradiance distribution of the associated light beams in the pupil plane 70.

Figure 15:
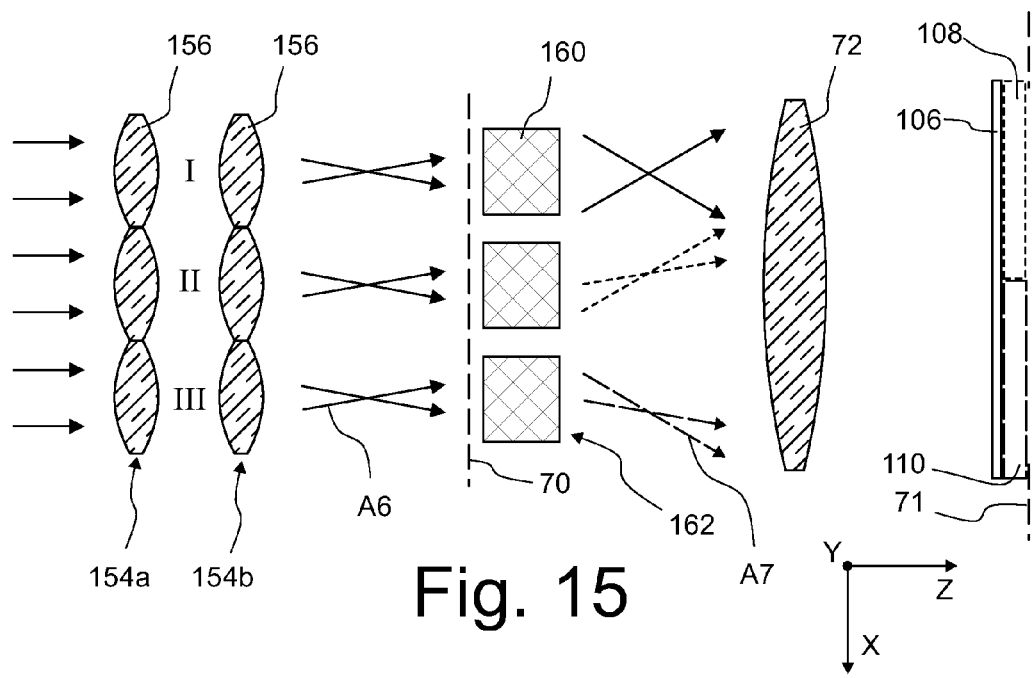
FIG. 15 is a schematic meridional section through three adjacent optical channels of the optical integrator shown in FIG. 14 in a representation similar to FIG. 8.

This will be explained in more detail with reference to FIG. 15 which shows, in a representation similar to FIG. 8, three adjacent optical channels I, II and II of the optical integrator 152.

The modulator units 160 are arranged at a position behind the second array 154b where the light beams associated with the optical channels I, II and II of the optical integrator 152 not yet superimpose. Thus the light impinging on each of the modulator units 160 is associated with only one of the optical channels I, II and III. As it has been mentioned above, the modulator units 160 modify the angular irradiance distribution of the associated light beams, which becomes clear from comparing the arrows A7 with the arrows A6 that represent light rays of the associated light beams behind and in front of the modulator units 160, respectively. The second condenser 72 translates the different angular irradiance distributions into different spatial irradiance distributions in the field stop plane 71.

In the upper optical channel I the modulator unit 160 is in an operating state in which the divergence of the light beam is increased. Consequently the spatial irradiance distribution illustrated in the field stop plane 71 by a solid line 106, has its maximum dimension along the X direction.

In the middle optical channel II the modulator unit 160 is in an operating state in which the divergence is not increased, but the light beam associated with this optical channel is tilted in the −X direction. This results in a spatial irradiance distribution which is represented in FIG. 15 by a broken line 108. This spatial irradiance distribution has a width along the X direction which is one half of the maximum width produced by the upper optical channel I, an irradiance level which is twice as high as the irradiance level produced by the upper optical channel II.

In the lower optical channel III the modulator unit 160 is in an operating state in which the light beam associated with this optical channel is tilted towards the +X direction. This results in the spatial irradiance distribution that is represented in FIG. 15 by a broken line 110.

Thus it is again possible, here by tilting the light beams associated with the modulator units 160 about a tilt axis which is parallel to the Y axis and thus perpendicular to the optical axis OA of the illumination system 112, to illuminate with a particular optical channel different portions of the field stop plane 71 and thus of the mask 16. If the modulator unit 160 of the upper optical channel was configured such that in a neutral operating state the divergence is not increased, the modulator 162 would have the same effect as the modulator 62 shown in FIG. 8.

Figure 16:
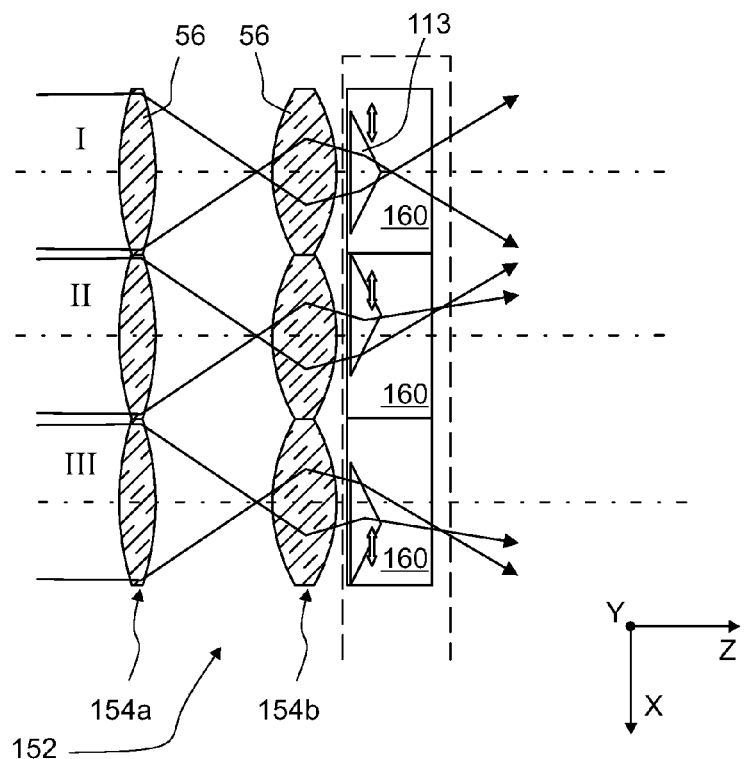
FIG. 16 is a cut-out from FIG. 15 showing optical elements within the modulator units.

FIG. 16 is a schematic meridional section through the optical integrator 152 and the modulator 160 for the three adjacent optical channels I, II and III. Each modulator unit 160 includes a triangular prism 113 and an actuator (not shown) which is configured to displace the prism 110 along the +X or −X direction in response to a control signal received from the control device 66. In the neutral position of the prism 113, which is shown for the modulator unit 160 associated with the upper optical channel I, the divergence is increased, but the light beam is not tilted in its entirety. If the actuators are operated and the prism 113 is displaced laterally along the −X or +X direction, as it is shown for the two modulator units 160 associated with the middle optical channel II and the lower optical channel III, the light beams associated with these optical channels are tilted about the Y direction, as it has been described above with reference to FIG. 15.

If the prism 113 is in a position between the centered position shown for the upper optical channel I and one of the end positions shown for the middle and lower optical channels II and III, a stepped irradiance distribution with two non-zero irradiance levels will be obtained in the field stop plane 71. The ratio between these two levels depends on the X position of the prism 113. Thus each optical channel can direct arbitrary fractions of light towards the two halves of the illuminated field in the field stop plane 71.

Also in this embodiment it is advantageous to have free space available between the optical channels I, II and III for accommodating the actuators that displace the prisms 113. This can be achieved by appropriately designing the optical integrator 152.

Figure 17:
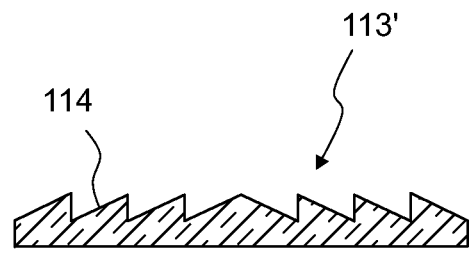
FIG. 17 is a cross-section in an XZ plane through a Fresnel prism that may alternatively be used as optical element in the modulator units shown in FIG. 16.

FIG. 17b is a cross section in an XZ plane through a prism 113' according to an alternative embodiment. The prism 113' of this embodiment is a "fresnelized" equivalent of the triangular prism 113 shown in FIG. 16. The Fresnel prism 113' thus does not have a cross section which is substantially triangular, but has a saw-tooth like stepped contour, as it is shown in FIG. 17. The Fresnel prism 113' may have advantages with regard to aberrations that may otherwise be produced by the triangular prism 113 shown in FIG. 16.

If the prisms 113 or 113' cannot be displaced along the X direction, for example because there is no available space for enabling the shifting movements of the prisms 113, 113' or for accommodating the actuators and support structures or other mechanical components, the prisms may be replaced by another refractive optical element that is displaced along the Y direction to modify the angular irradiance distribution of the light beams associated therewith.

Figure 18:
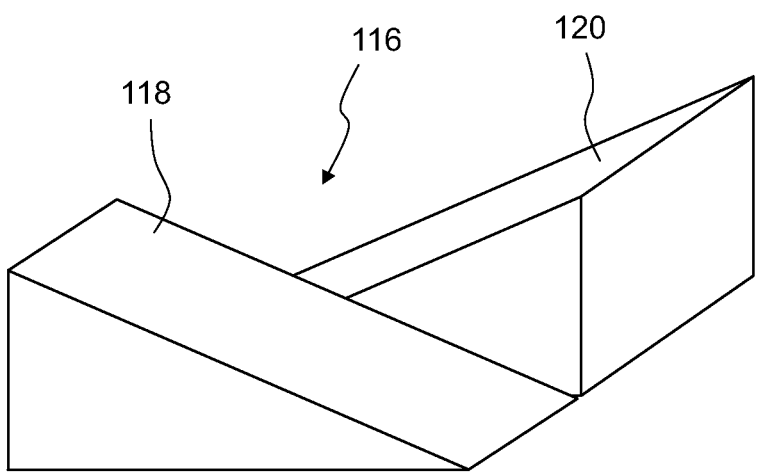
FIG. 18 is a perspective view of a still further embodiment of an optical element contained in a modulator unit including two wedges.
Figure 18:
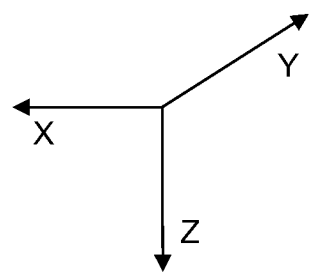

FIG. 18 is a perspective view of such a refractive optical element which is denoted in its entirety by 116. The optical element 116 includes two refractive wedges 118, 120 which are arranged side by side, wherein one wedge 118 is in a position that is obtained from the position of the other wedge 120 by rotating the wedge 118 by 180° about a rotational axis which is parallel to the Z direction. If the refractive optical element 116 is used in the modulator units 160 shown in FIG. 16 so that they can be displaced along the Y direction, it is possible, provided the dimensions are suitably determined, that either the wedge 118 or the wedge 120 is completely exposed to the light beam associated with the respective optical channel. Then the same effect is achieved as it is shown for the middle optical channel II and the lower optical channel III in FIG. 16. If the refractive optical element 116 is in a centered position in which one half of the light beam passes through the wedge 118 and the other half through the wedge 120, substantially the same effect as shown for the upper optical channel I in FIG. 16 is achieved.

VI.

Irradiance Management

In the foregoing only little attention has been given to the issue how the available amount of projection light is distributed over the various optical channels so that the desired irradiance and angular light distribution in the mask plane is obtained.

In the following it will be described how the irradiance management is performed if the illumination settings shown in FIG. 2 for the different pattern areas 181a, 181b, 181c on the one hand and 182a, 182b, 182c on the other hand shall be achieved.

Figure 19:
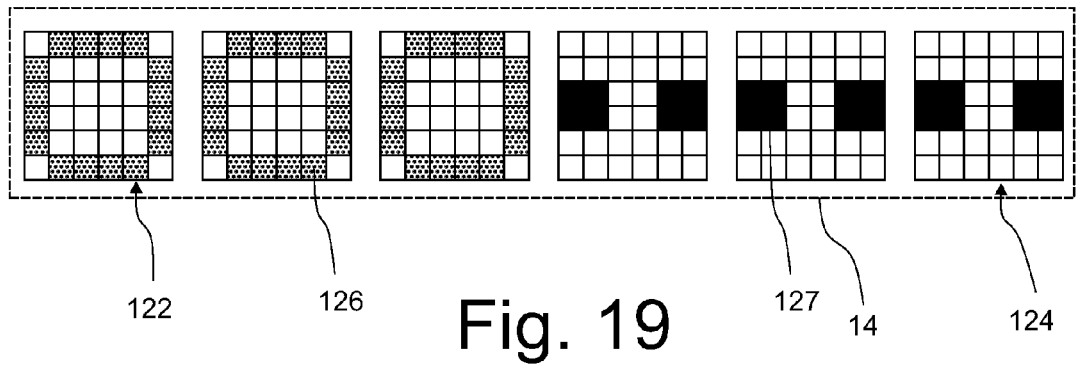
FIG. 19 is a schematic illustration of the angular irradiance distribution that discontinuously varies along an X direction of the illuminated field.

For the sake of simplicity it will be assumed that the available number of optical channels in the optical integrator is 6×6. FIG. 19 shows for this case schematically how the irradiance distribution in the pupil 26 associated with individual field points (referred to in the following as pupil irradiance distribution) has to vary along the X direction over the illuminated field 14. At the left half of the illuminated field 14 the illumination setting 122 shall be annular, and on the right half of the illuminated field 14 an X dipole illumination setting 124 shall be set. These two different illumination settings are approximated in the representation of FIG. 19 only roughly as a result of the restricted number of available optical channels.

It is further assumed that in the case of the annular illumination setting 122 the total area illuminated in the pupil is twice as large as in the case of the X dipole setting. Since the points on the mask 16 are supposed to receive the same amount of light irrespective whether they are located on the left or the right half of the illuminated field 14, the irradiance at the illuminated pupil areas is half as high for the annular illumination setting if compared to the X dipole illumination setting. This is illustrated in FIG. 19 by areas 126, 127 that are associated with different optical channels of the optical integrator 152 and have a different blackening.

Figure 20:
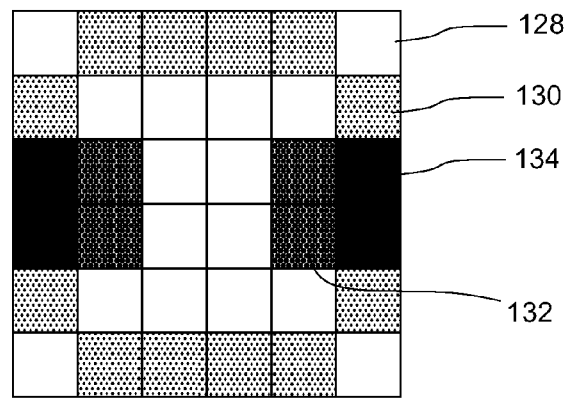
FIG. 20 is an illustration of the irradiance distribution in the raster field planes which produces the angular irradiance distribution shown in FIG. 19.

These pupil irradiance distributions, which are different for field points in the left and the right half of the illuminated field 14, have to be produced by the optical integrator 152 and the modulator 162. FIG. 20 illustrates the irradiance distribution which is used to this end in the pupil plane 70 of the illumination system 112. It can be seen that there are four different irradiance levels, namely a zero level 128 (white), a one third irradiance level 130 (light grey), a two third irradiance level 132 (dark grey) and a full irradiance level 13ˆ4 (black).

The highest irradiance level 134 is used for those optical channels that have to direct light to both halves of the illuminated field 14. More specifically, these optical channels have to direct one third of the available light to the left half of the illuminated field 14, in which the annular illumination setting shall be produced, and the remaining two thirds of the available light has to be directed to the right half of the illuminated field, in which the X dipole illumination setting shall be produced. Such a stepped irradiance distribution in the field stop plane 71 or the mask plane 78 can be obtained, for example, with a prism 113 or 113' being in a position between the centered position shown for the upper optical channel I in FIGS. 15 and 16 and the end positions shown for the middle optical channel II and the lower optical channel III.

The two third irradiance level 132 is used for those optical channels that exclusively direct their light to the right half of the illuminated field 14 so as to obtain the X dipole illumination setting 124. As it has been mentioned above, there the irradiance has to be twice as large as for the areas that direct their light exclusively to the left half of the illuminated field 14 where the annular illumination setting 122 shall be obtained. At these areas the one third irradiance level 130 is used.

The zero irradiance level 128 is used at those areas in the pupil plane 70 that shall direct no light at all to the illuminated field 14.

The four different irradiance levels 128, 130, 134, 132 can be easily achieved with the help of the mirror array 38 of the pupil defining unit 36. If we assume, for the sake of simplicity, that the array 38 includes (only) 36 mirrors that each produce the same irradiance, three mirrors 40 may direct the projection light to each optical channel at which the full irradiance level 134 is used, two mirrors 40 may direct the projection light to each optical channel at which the two thirds irradiance level 132 is used, and one mirror 40 may direct the projection light to each optical channel at which the one third irradiance level 130 is used. From the total of 36 mirrors four mirrors would remain that do not direct any light to the optical integrator 52 at all.

Often, however, the mirrors do not produce the same irradiance, as it has been assumed above, but quite different (albeit known) irradiances. Then the mirrors 40 producing the highest irradiances may be controlled in such a way that they direct projection light to those areas where the full irradiance level 134 is used. Mirrors 40 producing about two thirds of the full level 134 are controlled such that they direct projection light to areas where the two third irradiance level 132 is used, and so on.

VII.

Continuous Variation of Angular Irradiance Distribution

In the foregoing it has been assumed that there are two portions on the mask 16 which are located side by side along the X direction that shall be illuminated with different angular irradiance distributions. However, it may also be envisaged to illuminate the mask 16 in such a way that the angular irradiance distribution varies continuously, and in particular along a direction which is perpendicular to the scan direction Y.

Figure 21:
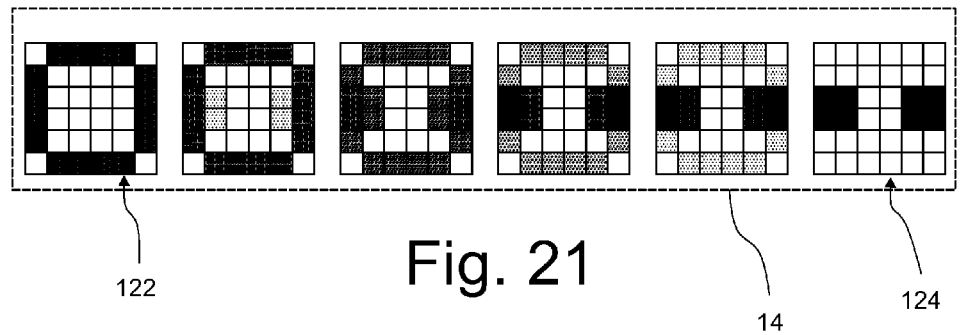
FIG. 21 is a schematic illustration of an angular irradiance distribution that continuously varies along an X direction of the illuminated field.

FIG. 21 illustrates, in a representation similar to FIG. 19, how the pupil irradiance distribution may vary within the illuminated field 14 along the X direction. At the left end of the illuminated field 14 an annular illumination setting 122 is produced. At the right end of the illuminated field 14 an X dipole illumination setting 124 is produced. The different grey shadings in the pupils between these opposite ends indicate how the angular irradiance distribution continuously varies between the two ends of the illuminated field 14.

Thus each line extending along the Y direction forms a portion in which the angular irradiance distribution is uniform, but this distribution continuously varies between the two special distributions at the opposite ends of the illuminated field 14 that are associated with the angular illumination setting 122 and the X dipole illumination setting 124.

Figure 22:
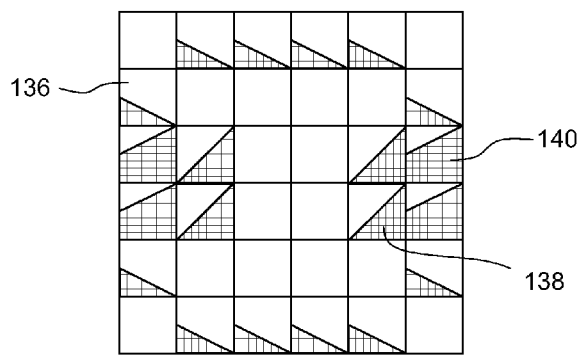
FIG. 22 is an illustration of the spatial irradiance distributions that are produced by the optical channels in the common field plane so as to produce the varying angular irradiance distribution illustrated in FIG. 21.

FIG. 22 illustrates for this scenario the irradiance distributions that have to be produced in the field stop plane 71 by each of a totality of 66 optical channels. By comparing FIGS. 21 and 22 it can be seen that some optical channels 136 have to produce an irradiance distribution which linearly decreases from a half maximum value at the left end of the illuminated field to zero at the right end of the illuminated field 14. Other optical channels 138 have to produce an irradiance distribution in the field stop plane 71 which linearly increases from zero to a maximum irradiance level. Still other optical channels 140 have to produce an irradiance distribution in the field stop plane 71 which linearly increases from a half maximum value at the left end of the illuminated field 14 to a maximum value at the right end of the illuminated field 14.

Figure 23:
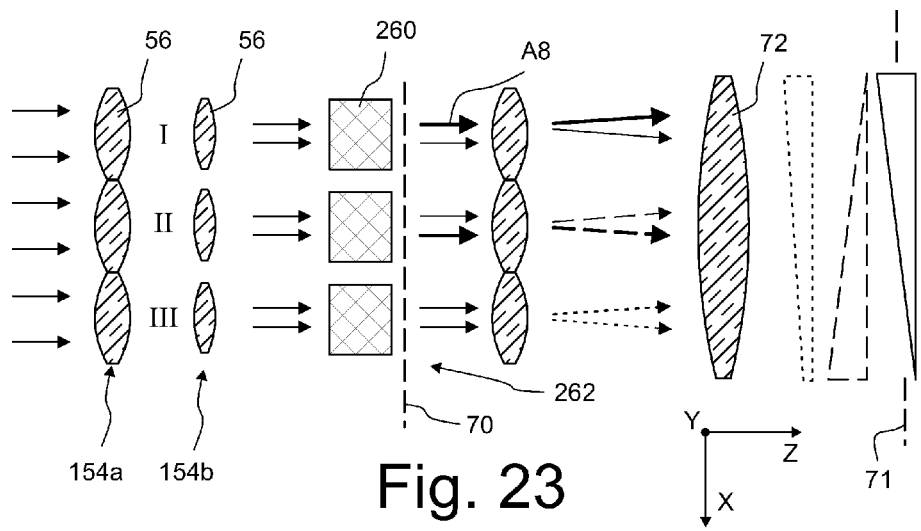
FIG. 23 is a schematic meridional section through three adjacent optical channels of an illumination system that produces a continuously varying angular irradiance distribution in the mask plane.

Such irradiance distributions can be produced with a modulator 262 that replaces the modulator 60 in the embodiment shown in FIG. 3. The function of the modulator 262 will now be explained with reference to FIG. 23 which is a meridional section through three adjacent optical channels I, II and III of the optical integrator 52 and modulator units 260 associated with the optical channels I, II and III. Other than the modulator units 60 shown in FIG. 8, the modulator units 262 shown in FIG. 23 are configured to change the irradiance distribution within the raster field plane 58, which is illuminated by the light beam associated with the modulator units 260, without shifting the irradiance distribution. In other words, the light is redistributed within the illuminated area, but the position of the area as such is not changed. In FIG. 23 this is represented by arrows A8 having a different thickness that indicates the irradiance at this X coordinate.

Figure 24:
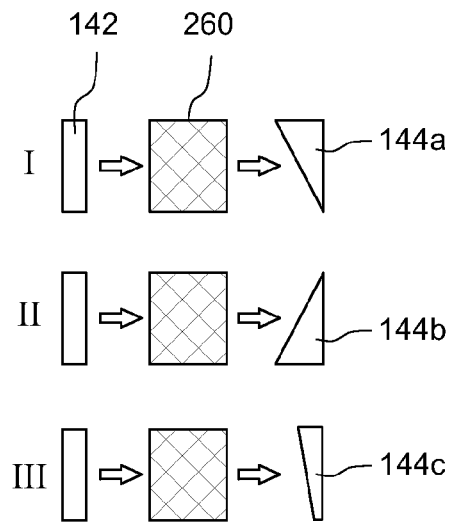
FIG. 24 is a cut-out from FIG. 23 that schematically illustrates how a top-hat irradiance distribution is transformed by the modulator units into different linearly decreasing or increasing irradiance distributions.

FIG. 24 illustrates this redistribution of the spatial irradiance distribution schematically for the three optical channels I, II and III shown in FIG. 23. Again it is assumed that the irradiance distribution at the entrance side of the modulator units 260 is uniform (i.e. a top hat distribution), as it is denoted by rectangles 142 in FIG. 23. The modulator units 260 transform this rectangular irradiance distribution 142 into the linearly decreasing or increasing distributions 144a, 144b and 144c shown on the right hand side of FIG. 24.

Referring again to FIG. 23, this redistribution of the spatial light distribution performed by the modulator units 260 produces the desired irradiance distributions 136, 138, 140 in the field stop plane 71, because the raster field plane 58 is optically conjugated to the field stop plane 71 by the optical raster elements 56 of the third array 54c and the second condenser 72.

The redistributions of a uniform spatial irradiance distribution 142 into various linearly increasing or decreasing spatial irradiance distributions, as it is schematically shown in FIG. 23, can be produced with the help of refractive optical elements that are contained in the modulator units 260. In the following it will be exemplarily described how a refractive optical element is shaped so that a uniform irradiance distribution 142 is transformed into an irradiance distribution 144b which linearly increases from zero to a maximum value.

Figure 25:
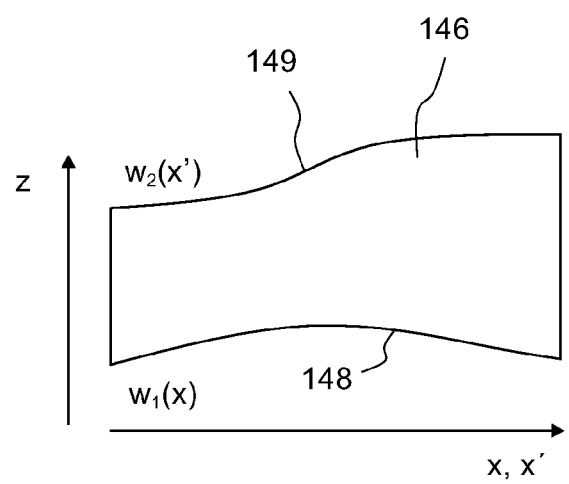
FIG. 25 is a graph indicating two optical surfaces of an optical member contained in the modulator units shown in FIGS. 23 and 24.

FIG. 25 shows, as a starting point, a refractive optical member 146 having a front surface 148 and a rear surface 149. The shape of the front surface is assumed to be given by an equation $w_1(x)$, and the shape of the rear surface 149 by an equation $w_2(x')$. It is further assumed that a light ray which enters the front surface 148 at a position x is refracted at the front surface 148 and leaves the rear surface 149 at a position x'.

The total light energy in a small volume element is preserved, i.e.

$$I(x)dx = I'(x')dx' \tag{1}$$

Assuming that the irradiance distribution 142 at the front surface 148 is uniform, the irradiance distribution $I'(x')$ at the rear surface 149 will be $$I'(x)' \propto \frac{dx}{dx'} \tag{2}$$

If the irradiance distribution shall increase linearly, the equation (3)

$$\frac{dx}{dx'} = \frac{2x'}{L} \tag{3}$$

has to be fulfilled, with L being the width of the illuminated area in the raster field plane 58.

Then the equations which have to be solved are (in paraxial approximation)

$$\frac{dw_1}{dx} = \frac{n}{n-1} \cdot \frac{x-x'}{w_2-w_1} \tag{4}$$

$$\frac{dw_2}{dx'} = \frac{n}{n-1} \cdot \frac{x-x'}{w_2-w_1}$$

$$\frac{dx}{dx'} = \frac{2x'}{L}$$

This set of equations may be understood simply: A ray which enters the refractive optical member 146 at a position x leaves the rear surface 149 at the position x'. The thickness between the front surface 148 and the rear surface 149 is given by $w_2(x')-w_1(x)$ which results in a deviation angle $(x'-x)/(w_2-w_1)$. The inclination of the front surface 148 is then defined by the right hand side of the equation for $dw_1/dx$. The rear surface 149 has the task of changing the direction of the light ray again to its original direction which it had when it entered the front surface 148.

With the auxiliary function $$a(s) = \tan\left(\sin^{-1}\left(\frac{s}{n\sqrt{1+s^2}}\right) - \tan^{-1} s\right) \quad (5)$$

the equation (4) can be rewritten as $$\frac{dw_1}{dx} = a^{-1}\left(\frac{x-x'}{w_2-w_1}\right) \quad (6)$$

$$\frac{dw_2}{dx'} = a^{-1}\left(\frac{x-x'}{w_2-w_1}\right)$$

$$\frac{dx}{dx'} = \frac{2x'}{L}$$

Figure 26:
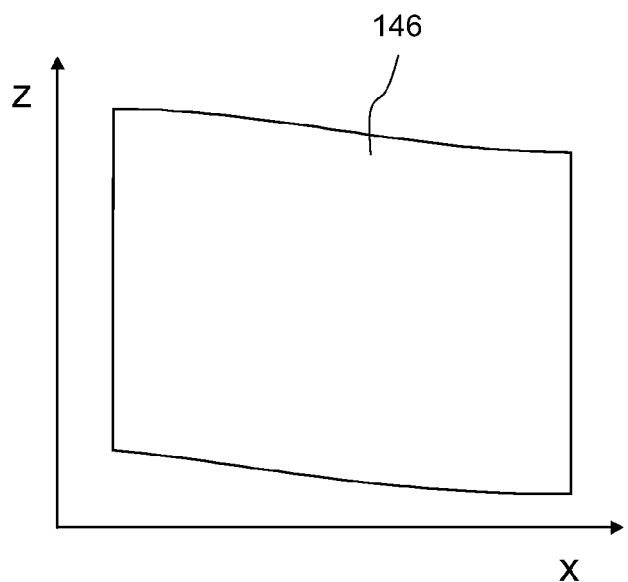
FIG. 26 is a graph showing the shape of the optical member in an XZ plane.

Numerically solving the equations (6) yields a refractive optical member 146 which has, in an XZ plane, the shape which is shown in FIG. 26.

FIG. 27 shows an optical element 150 which is contained in each modulator unit 260 and can be displaced along the Y direction with the help of an actuator (not shown). The optical element 150 consists of a first refractive optical member 146a and a second optical member 146b that both have the shape as shown in FIG. 26. The optical element 150 is assembled from the two optical members 146a, 146b with the optical member 146b being rotated by 180° around the Z axis.

The first optical member 146a transforms a uniform irradiance distribution into an irradiance distribution which decreases linearly from a maximum value to 0 along the X direction, as it is indicated by an irradiance distribution 144a on the right hand side if FIG. 27. The second optical member 146b redistributes the light such that the irradiance distribution obtained at its rear surface 149 linearly increases from 0 to a maximum value, as it is indicated by a broken line 146b. If the optical element 150 is displaced along the Y direction so that light impinges on both optical members 146a, 146b, the two linearly increasing and linearly decreasing irradiance distributions 144a, 144b are superimposed so that also linearly increasing distributions 144c between a first non-zero level and a second non-zero level can be produced, as it is shown in FIG. 24.

This is illustrated in FIGS. 28 to 30 which show the front surfaces 140 of the optical members 146a, 146b and an actuator 152 in three different operating states. The actuator 152 is configured to displace the optical element 150 along the Y direction.

In a first operating state shown in FIG. 28 an area 154, which is illuminated by the optical raster elements 56 of the first and second array 54a, 54b of one of the optical channels, lies completely within the front surface 140 of the first optical member 146a. As a result, the irradiance distribution 144a is produced at the rear surface 149 of the first refractive optical member 146a. Due to the optical conjugation this optical channel then produces the irradiance distribution 144a also at the mask plane 78.

FIG. 29 shows the optical element 150 in a second operating state in which the area 154 lies completely within the front surface 140 of the second refractive optical member 146b. Then the optical channel produces an irradiance distribution 144a which has the opposite field dependency, i.e. it linearly increases along the −X direction.

In the third operating state shown in FIG. 30 the optical element 150 has been moved along the Y direction such that a larger portion of the illuminated area 154 lies within the front surface 140 of the first optical member 146a, and a smaller portion of the illuminated area 154 lies within the front surface 140 of the second optical member 146b. Consequently, an irradiance distribution 144c is obtained which is a superposition of an increasing irradiance distribution 144a and a decreasing irradiance distribution 144b such that the irradiance distribution 144c. Thus it is possible, with the modulator units 260 as described with reference to FIGS. 23 to 30, to produce all irradiance distributions which have been shown in FIG. 22 and which are used such that an annular illumination setting continuously transforms into an X dipole illumination setting along the X direction of the illuminated field 14.

What is claimed is:

1. An illumination system, comprising:
    an optical integrator comprising an array of optical raster elements configured so that, during use of the illumination system, a light beam is associated with each optical raster element;
    a condenser configured so that, during use of the illumination system, the condenser superimposes the light beams associated with the optical raster elements in a common field plane which is a mask plane or which is optically conjugate to the mask plane;
    a modulator configured so that, during use of the illumination system, the modulator modifies a field dependency of an angular irradiance distribution in an illuminated field of the mask plane, the modulator comprising a plurality of modulator units, each modulator unit being:
        associated with one of the light beams;
        in front of the condenser so that only the associated light beam of the modulator unit impinges on the modulator unit; and
        configured so that, during use of the illumination system, the modulator variably redistributes, without blocking any light, a spatial and/or an angular irradiance distribution of its associated light beam; and
    a control device configured so that, during use of the illumination system, the control device controls the modulator units so that, during use of the illumination system:
        at least one modulator unit redistributes the spatial and/or the angular irradiance distribution of an associated light beam if the control device receives an input command that the field dependency of the angular irradiance distribution in the mask plane shall be modified;
        a first angular irradiance distribution is produced at a first portion of the illuminated field and a second angular irradiance distribution at a second portion of the illuminated field;
        the second angular irradiance distribution is distinct from the first angular irradiance distribution; and
        the first and second angular irradiance distributions are simultaneously produced, wherein the illumination system is a microlithographic illumination system.

2. The illumination system of claim 1, wherein the first portion of the illuminated field is a two-dimensional area in which the first angular irradiance distribution is uniform, and the second portion of the illuminated field is a two-dimensional area in which the second angular irradiance distribution is uniform.

3. The illumination system of claim 1, wherein:
the illuminated field has a long dimension in a first direction;
the illuminated field has a short dimension in a second direction perpendicular to the first direction;
the first portion of the illuminated field has at least one coordinate in the second direction in common with the second portion of the illumination field; and
the first portion of the illuminated field has no coordinate in the first direction in common with the second portion of the illuminated field.

4. The illumination system of claim 1, wherein the first and the second angular irradiance distributions are associated with illumination settings selected from the group consisting of conventional illumination settings, angular illumination settings, dipole illumination settings, and n-pole illumination settings with n≥4.

5. The illumination system of claim 1, wherein:
each modulator unit is in a raster field plane located, in a direction of light propagation, in front of the array of optical raster elements; and
each modulator unit is configured so that, during use of the illumination system, the modulator variably redistributes, without blocking any light, the spatial irradiance distribution of the associated light beam in the raster field plane.

6. The illumination system of claim 5, wherein each modulator unit is configured so that, during use of the illumination system, the modulator unit shifts an area in the raster field plane, which is illuminated by the light beam associated with the modulator unit, along a direction which is perpendicular to an optical axis of the illumination system.

7. The illumination system of claim 6, wherein each modulator unit is configured so that, during use of the illumination system, the modulator shifts the illuminated area without changing the angular irradiance distribution of the light beam.

8. The illumination system of claim 5, wherein:
the illuminated field has a long dimension in a first direction;
the illuminated field has a short dimension in a second direction perpendicular to the first direction;
the first portion of the illuminated field has at least one coordinate in the second direction in common with the second portion of the illumination field;
the first portion of the illuminated field has no coordinate in the first direction in common with the second portion of the illuminated field; and
the direction perpendicular to the optical axis of the illumination system is the first direction.

9. The illumination system of claim 1, wherein:
each modulator unit is arranged in or in close proximity to a pupil plane that is located, in a direction of light propagation, behind the array of optical raster elements; and
each modulator unit is configured so that, during use of the illumination system, the modulator unit variably redistributes, without blocking any light, the angular irradiance distribution of the associated light beam in the pupil plane.

10. The illumination system of claim 1, wherein each modulator unit comprises:
an optical element configured so that, during use of the illumination system, the optical element changes the propagation direction of the associated light beam impinging on the optical element; and
an actuator coupled to the optical element,
wherein the actuator is configured so that, during use of the illumination system, the actuator changes the position and/or orientation of the optical element in response to a control signal received from the control device.

11. The illumination system of claim 10, wherein the optical element is a refractive optical element, a prism, or a diffractive optical element.

12. The illumination system of claim 1, wherein the modulator is configured so that, during use of the illumination system, the angular irradiance distribution discontinuously varies over the illuminated field.

13. The illumination system of claim 1, wherein the modulator is configured so that, during use of the illumination system, the angular irradiance distribution continuously varies over at least a portion of the illuminated field.

14. The illumination system of claim 13, wherein:
the first portion of the illuminated field is a first line where the first angular irradiance distribution is uniform;
the second portion of the illuminated field is a second line where the second angular irradiance distribution is uniform; and
the modulator is configured so that, during use of the illumination system, the first angular irradiance distribution continuously transforms into the second angular irradiance transforms within an area arranged between the first line and the second line.

15. The illumination system of claim 14, wherein the first line adjoins one end of the illuminated field and the second line adjoins an opposite end of the illuminated field.

16. The illumination system of claim 15, wherein the one end and the opposite end delimit the illuminated field along an X direction of the illumination system.

17. The illumination system of claim 13, wherein each modulator unit is configured so that, during use of the illumination system, the modulator unit changes an irradiance distribution within an area in the raster field plane, which is illuminated by the light beam associated with the modulator unit, without shifting it.

18. The illumination system of claim 13, wherein each modulator unit is configured so that, during use of the illumination system, the modulator unit transforms the irradiance distribution from uniform irradiance distribution into a modified irradiance distribution which linearly increases or decreases along a reference direction.

19. The illumination system of claim 18, wherein the reference direction is equal to an X direction of the illumination system.

20. An apparatus, comprising:
an illumination system according to claim 1; and
a projection objective,
wherein the apparatus is a microlithographic projection exposure apparatus.

21. A method, the method comprising:
providing of a microlithographic projection exposure system which comprises a projection objective and an illumination system of claim 1;
defining a first desired angular irradiance distribution and a second desired angular irradiance distribution different from the first angular irradiance distribution;
controlling the modulator units so that at least one modulator unit redistributes the spatial and/or the angular irradiance distribution of an associated light beam, if the control device receives an input command that the field dependency of the angular irradiance distribution in the mask plane shall be modified, so that a first angular irradiance distribution is produced at a first portion of the illuminated field and a second angular irradiance distribution, which is distinct from the first angular irradiance distribution, is produced at a second portion of the illuminated field; and controlling the modulator units so that the first angular irradiance distribution is obtained at a first portion of the mask and the second angular irradiance distribution is obtained at a second portion of the mask that is distinct from the first portion.

22. An illumination system, comprising:

an optical integrator comprising an array of optical raster elements configured so that, during use of the illumination system, a light beam is associated with each optical raster element;

a condenser configured so that, during use of the illumination system, the condenser superimposes the light beams associated with the optical raster elements in a common field plane which is a mask plane or which is optically conjugate to the mask plane;

a modulator configured so that, during use of the illumination system, the modulator modifies a field dependency of an angular irradiance distribution in an illuminated field of the mask plane, the modulator comprising a plurality of modulator units, each modulator unit being:
  associated with one of the light beams;
  in front of the condenser so that only the associated light beam of the modulator unit impinges on the modulator unit; and
  configured so that, during use of the illumination system, the modulator variably redistributes, without blocking any light, a spatial and/or an angular irradiance distribution of its associated light beam; and a control device configured so that, during use of the illumination system, the control device controls the modulator units so that, during use of the illumination system:
  at least one modulator unit redistributes the spatial and/or the angular irradiance distribution of an associated light beam if the control device receives an input command that the field dependency of the angular irradiance distribution in the mask plane shall be modified; and
  a first angular irradiance distribution is produced at a first portion of the illuminated field and a second angular irradiance distribution at a second portion of the illuminated field, the second angular irradiance distribution being distinct from the first angular irradiance distribution, wherein:
  the illumination system is a microlithographic illumination system;
  each modulator unit is in a raster field plane located, in a direction of light propagation, in front of the array of optical raster elements;
  each modulator unit is configured so that, during use of the illumination system, the modulator variably redistributes, without blocking any light, the spatial irradiance distribution of the associated light beam in the raster field plane;
  the optical integrator comprises, along a direction of light propagation, first, second and third arrays of optical raster elements; and
  the raster field plane being located between the second and third arrays of optical raster elements.

23. An illumination system, comprising:

an optical integrator comprising an array of optical raster elements configured so that, during use of the illumination system, a light beam is associated with each optical raster element;

a condenser configured so that, during use of the illumination system, the condenser superimposes the light beams associated with the optical raster elements in a common field plane which is a mask plane or which is optically conjugate to the mask plane;

a modulator configured so that, during use of the illumination system, the modulator modifies a field dependency of an angular irradiance distribution in an illuminated field of the mask plane, the modulator comprising a plurality of modulator units, each modulator unit being:
  associated with one of the light beams;
  in front of the condenser so that only the associated light beam of the modulator unit impinges on the modulator unit; and
  configured so that, during use of the illumination system, the modulator variably redistributes, without blocking any light, a spatial and/or an angular irradiance distribution of its associated light beam; and a control device configured so that, during use of the illumination system, the control device controls the modulator units so that, during use of the illumination system:
  at least one modulator unit redistributes the spatial and/or the angular irradiance distribution of an associated light beam if the control device receives an input command that the field dependency of the angular irradiance distribution in the mask plane shall be modified; and
  a first angular irradiance distribution is produced at a first portion of the illuminated field and a second angular irradiance distribution at a second portion of the illuminated field, the second angular irradiance distribution being distinct from the first angular irradiance distribution, wherein:
  the illumination system is a microlithographic illumination system;
  each modulator unit is arranged in or in close proximity to a pupil plane that is located, in a direction of light propagation, behind the array of optical raster elements;
  each modulator unit is configured so that, during use of the illumination system, the modulator unit variably redistributes, without blocking any light, the angular irradiance distribution of the associated light beam in the pupil plane; and
  each modulator unit is configured so that, during use of the illumination system, each modulator tilts the light beam associated with the modulator unit about a tilt axis which is perpendicular to an optical axis of the illumination system.

24. An illumination system, comprising:

an optical integrator comprising an array of optical raster elements configured so that, during use of the illumination system, a light beam is associated with each optical raster element;

a condenser configured so that, during use of the illumination system, the condenser superimposes the light beams associated with the optical raster elements in a common field plane which is a mask plane or which is optically conjugate to the mask plane;

a modulator configured so that, during use of the illumination system, the modulator modifies a field dependency of an angular irradiance distribution in an illuminated field of the mask plane, the modulator comprising a plurality of modulator units, each modulator unit being:
  associated with one of the light beams;

in front of the condenser so that only the associated light beam of the modulator unit impinges on the modulator unit; and configured so that, during use of the illumination system, the modulator variably redistributes, without blocking any light, a spatial and/or an angular irradiance distribution of its associated light beam; and a control device configured so that, during use of the illumination system, the control device controls the modulator units so that, during use of the illumination system:

at least one modulator unit redistributes the spatial and/or the angular irradiance distribution of an associated light beam if the control device receives an input command that the field dependency of the angular irradiance distribution in the mask plane shall be modified; and a first angular irradiance distribution is produced at a first portion of the illuminated field and a second angular irradiance distribution at a second portion of the illuminated field, the second angular irradiance distribution being distinct from the first angular irradiance distribution, wherein:

the illumination system is a microlithographic illumination system;

the illuminated field has a long dimension in a first direction;

the illuminated field has a short dimension in a second direction perpendicular to the first direction;

the first portion of the illuminated field has at least one coordinate in the second direction in common with the second portion of the illumination field;

the first portion of the illuminated field has no coordinate in the first direction in common with the second portion of the illuminated field;

each modulator unit is configured so that, during use of the illumination system, each modulator tilts the light beam associated with the modulator unit about a tilt axis which is perpendicular to an optical axis of the illumination system; and the tilt axis is equal to the second direction.

25. An illumination system, comprising:

an optical integrator comprising an array of optical raster elements configured so that, during use of the illumination system, a light beam is associated with each optical raster element;

a condenser configured so that, during use of the illumination system, the condenser superimposes the light beams associated with the optical raster elements in a common field plane which is a mask plane or which is optically conjugate to the mask plane;

a modulator configured so that, during use of the illumination system, the modulator modifies a field dependency of an angular irradiance distribution in an illuminated field of the mask plane, the modulator comprising a plurality of modulator units, each modulator unit being:

associated with one of the light beams;

in front of the condenser so that only the associated light beam of the modulator unit impinges on the modulator unit; and configured so that, during use of the illumination system, the modulator variably redistributes, without blocking any light, a spatial and/or an angular irradiance distribution of its associated light beam; and a control device configured so that, during use of the illumination system, the control device controls the modulator units so that, during use of the illumination system:

at least one modulator unit redistributes the spatial and/or the angular irradiance distribution of an associated light beam if the control device receives an input command that the field dependency of the angular irradiance distribution in the mask plane shall be modified; and a first angular irradiance distribution is produced at a first portion of the illuminated field and a second angular irradiance distribution at a second portion of the illuminated field, the second angular irradiance distribution being distinct from the first angular irradiance distribution, wherein:

the illumination system is a microlithographic illumination system;

each modulator unit comprises:

an optical element configured so that, during use of the illumination system, the optical element changes the propagation direction of the associated light beam impinging on the optical element; and an actuator coupled to the optical element;

the actuator is configured so that, during use of the illumination system, the actuator changes the position and/or orientation of the optical element in response to a control signal received from the control device; and the actuator is configured so that, during use of the illumination system, the actuator displaces the optical element along a direction that is inclined with respect to an optical axis of the illumination system.

26. An illumination system, comprising:

an optical integrator comprising an array of optical raster elements configured so that, during use of the illumination system, a light beam is associated with each optical raster element;

a condenser configured so that, during use of the illumination system, the condenser superimposes the light beams associated with the optical raster elements in a common field plane which is a mask plane or which is optically conjugate to the mask plane;

a modulator configured so that, during use of the illumination system, the modulator modifies a field dependency of an angular irradiance distribution in an illuminated field of the mask plane, the modulator comprising a plurality of modulator units, each modulator unit being:

associated with one of the light beams;

in front of the condenser so that only the associated light beam of the modulator unit impinges on the modulator unit; and configured so that, during use of the illumination system, the modulator variably redistributes, without blocking any light, a spatial and/or an angular irradiance distribution of its associated light beam; and a control device configured so that, during use of the illumination system, the control device controls the modulator units so that, during use of the illumination system:

at least one modulator unit redistributes the spatial and/or the angular irradiance distribution of an associated light beam if the control device receives an input command that the field dependency of the angular irradiance distribution in the mask plane shall be modified; and a first angular irradiance distribution is produced at a first portion of the illuminated field and a second angular irradiance distribution at a second portion of the illuminated field, the second angular irradiance distribution being distinct from the first angular irradiance distribution, wherein:
the illumination system is a microlithographic illumination system;
each modulator unit comprises:
an optical element configured so that, during use of the illumination system, the optical element changes the propagation direction of the associated light beam impinging on the optical element; and
an actuator coupled to the optical element;
the actuator is configured so that, during use of the illumination system, the actuator changes the position and/or orientation of the optical element in response to a control signal received from the control device; and
the actuator is configured so that, during use of the illumination system, the actuator rotates the optical element around a rotational axis that is inclined with respect to an optical axis of the illumination system.

* * * * *

UNITED STATES PATENT AND TRADEMARK OFFICE
CERTIFICATE OF CORRECTION

| | |
|---|---|
| PATENT NO. | : 9,213,244 B2 |
| APPLICATION NO. | : 13/727903 |
| DATED | : December 15, 2015 |
| INVENTOR(S) | : Michael Patra and Markus Schwab |

It is certified that error appears in the above-identified patent and that said Letters Patent is hereby corrected as shown below:

Title Page 2, Col. 2, line 5 under "OTHER PUBLICATIONS", delete " $\gamma, \bar{\gamma}$ " and insert -- $y, \bar{\phantom{y}}$ --.

Specification

Col. 9, line 48, delete "21," and insert -- 21; --.

Col. 10, make lines 62-64 a continuation of the paragraph on line 61.

Col. 12, line 13, delete "66" and insert -- 6×6 --.

Signed and Sealed this
Third Day of May, 2016

Michelle K. Lee
*Director of the United States Patent and Trademark Office*